United States Patent
Cui

(10) Patent No.: US 10,005,991 B2
(45) Date of Patent: Jun. 26, 2018

(54) REMOVAL COMPOSITION FOR SELECTIVELY REMOVING HARD MASK AND METHODS THEREOF

(71) Applicants: E. I. DU PONT DE NEMOURS AND COMPANY, Wilmington, DE (US); EKC TECHNOLOGY INC, Hayward, CA (US)

(72) Inventor: Hua Cui, Castro Valley, CA (US)

(73) Assignees: EKC TECHNOLOGY INC CA (US); E I DU PONT DE NEMOURS AND COMPANY, Wilmington, DE (US)

(*) Notice: Subject to any disclaimer, the term of this patent is extended or adjusted under 35 U.S.C. 154(b) by 0 days. days.

(21) Appl. No.: 15/028,573

(22) PCT Filed: Oct. 9, 2014

(86) PCT No.: PCT/US2014/059848
§ 371 (c)(1),
(2) Date: Apr. 11, 2016

(87) PCT Pub. No.: WO2015/054464
PCT Pub. Date: Apr. 16, 2015

(65) Prior Publication Data
US 2016/0254182 A1 Sep. 1, 2016

Related U.S. Application Data

(63) Continuation of application No. 14/103,303, filed on Dec. 11, 2013, now abandoned.
(Continued)

(51) Int. Cl.
*C11D 7/32* (2006.01)
*C11D 11/00* (2006.01)
(Continued)

(52) U.S. Cl.
CPC ............ *C11D 11/0047* (2013.01); *B08B 3/08* (2013.01); *B08B 3/10* (2013.01); *C11D 3/2082* (2013.01);
(Continued)

(58) Field of Classification Search
CPC .................................................. C11D 11/0047
(Continued)

(56) References Cited

U.S. PATENT DOCUMENTS

| 8,080,475 B2 | 12/2011 | RamachandraRao et al. |
| 2001/0003061 A1 | 6/2001 | Chen et al. |

(Continued)

FOREIGN PATENT DOCUMENTS

| EP | 0292057 A1 | 11/1988 |
| EP | 2234145 A1 | 9/2010 |

(Continued)

OTHER PUBLICATIONS

International Search Report dated Jan. 15, 2015 for International Patent Application No. PCT/US2014/059848.
(Continued)

Primary Examiner — Gregory Webb
(74) Attorney, Agent, or Firm — Simon L. Xu

(57) ABSTRACT

The present disclosure relates to a method for removing a hard mask consisting essentially of TiN, TaN, TiNxOy, TiW, W, Ti and alloys of Ti and W from a semiconductor substrate. The method comprising contacting the semiconductor substrate with a removal composition. The removal composition comprises 0.1 wt % to 90 wt % of an oxidizing agent; 0.0001 wt % to 50 wt % of a carboxylate; and the balance up to 100 wt % of the removal composition comprising deionized water.

19 Claims, 4 Drawing Sheets

Related U.S. Application Data

(60) Provisional application No. 61/889,968, filed on Oct. 11, 2013.

(51) Int. Cl.

| | | |
|---|---|---|
| *G03F 7/42* | (2006.01) | |
| *H01L 21/02* | (2006.01) | |
| *H01L 21/3213* | (2006.01) | |
| *C23F 1/18* | (2006.01) | |
| *C23F 1/26* | (2006.01) | |
| *C23F 1/28* | (2006.01) | |
| *C23F 1/34* | (2006.01) | |
| *C23F 1/38* | (2006.01) | |
| *C23F 1/40* | (2006.01) | |
| *C11D 3/39* | (2006.01) | |
| *C11D 7/26* | (2006.01) | |
| *B08B 3/08* | (2006.01) | |
| *C11D 7/04* | (2006.01) | |
| *B08B 3/10* | (2006.01) | |
| *C11D 3/20* | (2006.01) | |
| *H01L 21/768* | (2006.01) | |
| *H01L 21/311* | (2006.01) | |

(52) U.S. Cl.
CPC .......... *C11D 3/3942* (2013.01); *C11D 3/3947* (2013.01); *C11D 7/04* (2013.01); *C11D 7/265* (2013.01); *C11D 7/3209* (2013.01); *C11D 7/3218* (2013.01); *C11D 7/3245* (2013.01); *C11D 7/3281* (2013.01); *C23F 1/18* (2013.01); *C23F 1/26* (2013.01); *C23F 1/28* (2013.01); *C23F 1/34* (2013.01); *C23F 1/38* (2013.01); *C23F 1/40* (2013.01); *G03F 7/423* (2013.01); *G03F 7/425* (2013.01); *G03F 7/426* (2013.01); *H01L 21/02057* (2013.01); *H01L 21/02063* (2013.01); *H01L 21/31111* (2013.01); *H01L 21/32134* (2013.01); *H01L 21/76807* (2013.01); *H01L 21/76814* (2013.01); *H01L 21/31144* (2013.01)

(58) Field of Classification Search
USPC ........................................................ 510/175
See application file for complete search history.

(56) References Cited

U.S. PATENT DOCUMENTS

2011/0275164 A1* 11/2011 Visintin ............ H01L 21/02079
438/4
2015/0027978 A1* 1/2015 Barnes .................. C09K 13/00
216/13

FOREIGN PATENT DOCUMENTS

| EP | 2322692 A1 | 5/2011 |
|---|---|---|
| JP | 2006339509 A | 12/2006 |
| WO | 2013/101907 A1 | 7/2013 |

OTHER PUBLICATIONS

Steven Verhaverbeke, PH.D. et al., "A Model for the Etching of Ti and TiN in Sc-1 Solutions", Mat. Res. Soc. Symp. Proc., vol. 447, 1997 Materials Research Society.

* cited by examiner

REMOVAL COMPOSITION FOR SELECTIVELY REMOVING HARD MASK AND METHODS THEREOF

REFERENCE STATEMENT

This application claims the benefit of U.S. provisional application Ser. No. 61/889,968, filed Oct. 11, 2013, the entire contents of which are hereby incorporated herein by reference.

BACKGROUND OF THE DISCLOSURE

The presently disclosed and claimed inventive concept(s) relates to compositions and methods for selectively removing hard mask and other residues from integrated circuit (IC) device substrates, and, more particularly, to compositions and methods useful for selectively removing TiN, TaN, TiNxOy, TiW, Ti and W hard mask, and hard masks comprising alloys of the foregoing, as well as other residues from such substrates comprising low-k dielectric materials, TEOS, copper, cobalt and other low-k dielectric materials, using a carboxylate compound.

Plasma dry etching is commonly used to fabricate vertical sidewall trenches and anisotropic interconnecting vias in copper (Cu)/low-k dual damascene fabrication processes. As the technology nodes advance to 45 nm and smaller, the decreasing size of the semiconductor devices makes achieving critical profile control of vias and trenches more challenging. Integrated circuit device companies are investigating the use of a variety of hard masks to improve etch selectivity to low-k materials and thereby gain better profile control.

In order to obtain high yield and low resistance, polymer residues on the sidewalls and the particulate/polymer residues at the via bottoms that are generated during etching must be removed prior to the next process step. It would be very beneficial if the removal composition (cleaning solution) can also effectively etch the hard mask to form an intermediate morphology, e.g., a pulled-back/rounded morphology, or completely remove the hard mask. A pulled-back/rounded morphology could prevent undercutting the hard mask, which, in turn, could enable reliable deposition of barrier metal, Cu seed layer and Cu filling. Alternatively, fully removing the hard mask using the same composition could offer numerous benefits to downstream process steps, particularly chemical mechanical polishing (CMP), by eliminating a need for barrier CMP.

Following almost every step in the fabrication process, e.g., a planarization step, a photolithography step, or an etching step, removal (cleaning) processes are required to remove residues of the plasma etch, photoresist, oxidizer, abrasive, metal and/or other liquids or particles that remain and which can contaminate the surface of the device if they are not effectively removed. Fabrication of advanced generation devices that require copper conductors and low-k dielectric materials (typically carbon-doped silicon oxide (SiOCH), or porous low-k materials) give rise to the problem that both materials can react with and be damaged by various classes of prior art cleaners.

Low-k dielectrics, in particular, may be damaged in the removal process as evidenced by etching, changes in porosity/size, and ultimately changes in dielectric properties. Time required to remove residues depends on the nature of the residue, the process (heating, crosslinking, etching, baking, and/or ashing) by which it was created, and whether batch or single wafer removal processes can be used. Some residues may be cleaned in a very short period of time, while some residues require much longer removal procedures. Compatibility with both the low-k dielectric and with the copper conductor over the duration of contact with the removal composition is a desired characteristic.

During back-end-of-line (BEOL) IC fabrication processes, i.e., dual damascene processes, TiN, TaN, TiNxOy, TiW, Ti, and/or W (including alloys of Ti and W) are used as an hard mask in the formation of vias and trenches to gain high selectivity to low-k dielectric materials during dry etching steps. Effective removal compositions are required that can selectively remove the TiN, TaN, TiNxOy, TiW, Ti or W, be compatible with low-k materials, copper, cobalt and other dielectric materials, and also simultaneously remove unwanted etching residues and Cu oxide from the resulting dual damascene structure. Beyond selective removal, it is also highly desirable that the achievable removal rate of a hard mask (A/min) for the removal composition be maintained substantially constant for an extended period of time.

With the continuing reduction in device critical dimensions and corresponding requirements for high production efficiency and reliable device performance, there is a need for such improved removal compositions.

SUMMARY

The present disclosure relates to method for semiconductor processing. The method uses a removal composition, with one or more carboxylates which provides highly selective removal of hard mask from a dual damascene structure without damaging wiring metallurgy and dielectric materials. Semiconductor substrates of the type fabricated in dual damascene back end metallization consist of multiple layers or levels of metal interconnects that are isolated by interlayer dielectrics (Low-k dielectric material). The removal composition can remove hard mask etch residues, photoresist, polymeric materials, and copper oxide from via and trench surfaces without damaging underlying layers that form the structure.

The method for removing a hard mask consisting essentially of TiN, TaN, TiNxOy, TiW, W, Ti and alloys of Ti and W from a semiconductor substrate, comprises contacting the semiconductor substrate with a removal composition comprising (a) 0.1 wt % to 90 wt % at least one oxidizing agent, (b) 0.0001 wt % to 50 wt % of a carboxylate and (c) the balance up to 100 wt % of the removal composition comprising deionized water.

Figure 1A:
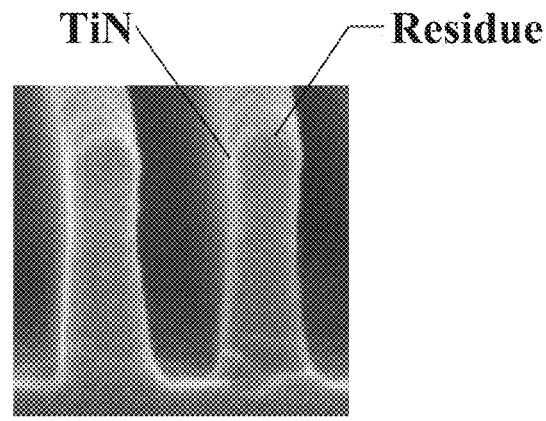
FIGS. 1A and 1B are cross-sectional SEM images of semiconductor wafer segments which show trenches and vias, respectively, during dual damascene device fabrication, but prior to contact with the removal composition of the invention.

1A and 1B after contact with removal composition 3 from Table 1 at 53° Detailed C for 90 sec.

DETAILED DESCRIPTION

It is recognized that various components of the compositions of this invention may interact, and, therefore, any composition is expressed as the amount of various components which, when added together, form the composition. Unless specifically stated otherwise, any composition given in percent is percent by weight (wt %) of that component that has been added to the composition. When the composition is described as being substantially free of a particular component, generally there are numeric ranges provided to guide one of ordinary skill in the art to what is meant by "substantially free," but in all cases "substantially free" encompasses the preferred embodiment where the composition is totally free of that particular component.

As noted briefly above, the dual damascene process is used to form metal interconnects in the backend metallization, which are then used to electrically interconnect various electrical components in a semiconductor substrate into functional circuits. A discussion of backend metallization, which comprises fabrication of multiple levels, or layers, of metal interconnects isolated by an interlayer dielectric layer(s) and/or barrier layer(s) can be found, for example, in U.S. Pat. No. 8,080,475, the teachings of which are incorporated herein in their entirety by reference. The integration of new materials, such as ultra low-k dielectrics, into microelectronic devices places new demands on removal performance. Concurrently, shrinking device dimensions reduces the tolerances for changes in critical dimensions for vias and trenches.

The described and claimed inventive concept(s) reside in the discovery that selective removal of hard mask from semiconductor substrate wherein said hard mask is in overlapping relationship with a low-k dielectric material can be accomplished by incorporating into the removal composition an effective amount of from 0.0001 wt % up to 50 wt % of a carboxylate. In a preferred embodiment, the concentration of carboxylate is from 0.001 wt % up to 10 wt %. Another advantage is the addition of a carboxylate increases the etch rate of a hard mask selected from TiN, TaN, TiNxOy, TiW, W, Ti, including alloys of Ti and W.

Yet another advantage resides in the discovery that ammonium carboxylates in combination with CDTA in removal composition of the present disclosure increase etch rate as well as stabilize the etch rate. And yet another advantage resides in the discovery that ammonium ethylenediaminetetraacetic acids not only increase the etch rate but also stabilize the etch rate.

The chemicals in a removal composition for removing a metal hard mask can decompose over time. The term "stabilize" or "stabilized" is used herein to mean that the achievable etch rate for a hard mask remains substantially constant over an extended period of time, e.g., a time period of from twenty two (22) hours and up to thirty five (35) hours or longer at the selected operating temperature. For example, the etch rate of the removal composition after for 2, 4, or 8 hrs of use is substantially the same after 20, 24 or 35 hrs of use.

The term "substantially constant" is intended to mean that decomposition over time is minimized or less than if ammonium ethylenediaminetetraacetic acids or a combination of ammonium carboxylate(s) and amino acid, amine polycarboxylic acid, carboxylic acid or polycarboxylic acid chelating agent were not used in the removal composition. Thus, the etch rate does not decrease as much as when ammonium ethylenediaminetetraacetic acids or a combination of ammonium carboxylate(s) and amino acid, amine polycarboxylic acid, carboxylic acid or polycarboxylic acid chelating agent were not used.

The term "selectively removing" is intended to mean removing the hard mask without damaging the underlying metal conductor layer (metal interconnect) and Low-k dielectric material. Low-k dielectric material is any material used as a dielectric material in a semiconductor substrate or any microelectrinic device where in the dielectric constant is less than 3.5. Examples of useful Low-k dielectric materials include but are not limited to: silicon dioxide ($SiO_2$), carbon-doped silicon oxide (SiOCH), low-polarity materials such as organic polymers, hybrid organic, inorganic materials, organosilicate glass (OSG), and carbon-doped oxide (CDO) glass. The incorporation of porosity, i.e. air-filled pores, in these materials further lowers the dielectric constant of the material.

Carboxylate

The term "carboxylate" is used herein to mean the general formula M(RCOO)n, where M is a metal and n is 1, 2, . . . is the number of carboxylate esters within the compound having the general formula RCOOR', wherein R and R' are organic groups with the proviso that R'≠H. When chemistries of the type described herein are used in electronic device fabrication, such as fabricating IC devices, it is preferable not to have any metal impurities in the chemical composition. In such cases, M is replaced with $NH4+$. The removal composition of the present disclosure selectively removes a hard mask from a semiconductor substrate. The hard mask consists essentially of TiN, TaN, TiNxOy, TiW, W, Ti and alloys of Ti and W. The removal composition selectively removes the hard mask relative to the low-k dielectric material of a semiconductor substrate. The removal composition comprises:

(a) from 0.1 wt % to 90 wt % of an oxidizing agent;
(b) from 0.0001 wt % to 50 wt % of a carboxylate; and
(c) the balance up to 100 wt % of the removal composition comprising deionized water.

The presence of a carboxylate in the removal composition increases the etch rate of a metal hard mark at least 8% when compared to the same removal composition with out a carboxylate and in some embodiments, at least 39% or 43% or 50% or 60% or 75 or 80%. In some embodiments, the carboxylate is selected from the group consisting of potassium citrate tribasic monohydrate, potassium sodium tartrate tetrahydrate, potassium L-Lactate and mixtures thereof.

In some embodiments, the carboxylate is an ammonium carboxylate. In some embodiments, the ammonium carboxylate is selected from the group consisting of ammonium oxalate, ammonium lactate, ammonium tartrate. ammonium citrate tribasic, ammonium acetate, ammonium carbamate, ammonium carbonate, ammonium benzoate, ammonium ethylenediaminetetraacetic acid, diammonium ethylenediaminetetraacetic acid, triammonium ethylenediaminetetraacetic acid, tetraammonium ethylenediaminetetraacetic acid, ammonium succinate, ammonium formate, ammonium 1-H-pyrazole-3-carboxylate and mixtures thereof.

The carboxylate is present in an amount from 0.0001 wt % to 50 wt % based on the total weight of the removal composition. In some embodiments, the carboxylate is present in an amount from 0.0001 wt % to 25 wt % based on the total weight of the removal composition. In some embodiments, the carboxylate is present in an amount from 0.0001 wt % to 100 wt % based on the total weight of the removal composition. In another embodiment, the carboxylate is present in an amount from 0.0001 wt % to 0.6 wt % based on the total weight of the removal composition. In another embodiment, the carboxylate is present in an amount from 0.001 wt % to 50 wt % based on the total weight of the removal composition. In another embodiment, the carboxylate is present in an amount from 0.001 wt % to 100 wt % based on the total weight of the removal composition.

In yet another embodiment, the carboxylate is present in an amount from 0.2 to 0.5 wt % based on the total weight of the removal composition In yet another embodiment, the ammonium carboxylate is present in an amount from 0.0001 wt % to 50 wt % based on the total weight of the removal composition. In some embodiments, the ammonium carboxylate is present in an amount from 0.0001 wt % to 25 wt % based on the total weight of the removal composition. In some embodiments, the ammonium carboxylate is present in an amount from 0.0001 wt % to 10 wt % based on the total weight of the removal composition. In another embodiment, the ammonium carboxylate is present in an amount from 0.0001 to 0.6 wt % based on the total weight of the removal composition. In yet another embodiment, the ammonium carboxylate is present in an amount from 0.001 wt % to 50 wt % based on the total weight of the removal composition. In another embodiment, the ammonium carboxylate is present in an amount from 0.001 wt % to 10 wt % based on the total weight of the removal composition. In yet another embodiment, the ammonium carboxylate is present in an amount from 0.2 to 0.5 wt % based on the total weight of the removal composition In some embodiments, the ammonium carboxylate is an ammonium ethylenediaminetetraacetic acid or mixture thereof. The presence of ammonium ethylenediaminetetraacetic acids in the removal compositions of this disclosure not only increased the etch rate of the hard mask but also operates to stabilize the achievable etch rate over an extended period of time (up to at least 22 hours and in some embodiments up to at least 35 hours).

In some embodiments, the ammonium ethylenediaminetetraacetic acids are selected from the group consisting of ammonium ethylenediaminetetraacetic acid, diammonium ethylenediaminetetraacetic acid, triammonium ethylenediaminetetraacetic acid, tetraammonium ethylenediaminetetraacetic acid and mixtures thereof.

In one embodiment, ammonium ethylenediaminetetraacetic acids stabilize etch rate. In some embodiments, ammonium ethylenediaminetetraacetic acids stabilize TiN etch rate. In some embodiments, ammonium ethylenediaminetetraacetic acids stabilize TiN etch rate such that TiN etch rate at 50° C. does not drop more than 20% or 45 Å/min at 35 hours. The etch rate at 50° C. of a removal composition without the addition of an ammonium ethylenediaminetetraacetic acid, drops 60% or 86 Å/min at 35 hours.

In some embodiments, the ammonium carboxylate is tetraammonium ethylenediaminetetraacetic acid. In some embodiments, tetraammonium ethylenediaminetetraacetic acid stabilizes the TiN etch rate such that TiN etch rate at 50° C. which does not drop more than 20% or 45 Å/min at 35 hours. For a removal composition without tetraammonium ethylenediaminetetraacetic acid, the TiN etch rate at 50° C. drops 60% or 86 Å/min at 35 hours.

Oxidizing Agent

Oxidizing agents useful according to the inventive concept(s) are selected from any substance which has the capability to chemically react with the hard mask and effect its removal. The removal composition oxidizing agent is selected from the group consisting of hydrogen peroxide ($H_2O_2$), n-methylmorpholine oxide (NMMO or NMO), benzoyl peroxide, tetrabutylammonium peroxymonosulfate, ozone, ferric chloride, permanganate peroxoborate, perchlorate, persulfate, ammonium peroxydisulfate, per acetic acid, urea hydroperoxide, nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($NCH_3)_4)S_2O_8$), (($CO(NH_2)_2)H_2O_2$), peracetic acid ($CH_3(CO)OOH$), and mixtures thereof. Among the foregoing, $H_2O_2$ is a most preferred oxidizing agent being low concentration of metals and providing ease of handling and lower relative cost.

In one embodiment, the removal composition comprises from 0.1 wt % to 90 wt % of an oxidizing agent. In another embodiment, the removal composition comprises from 0.1 wt % to 24 wt % of an oxidizing agent. In another embodiment, the removal composition comprises from 3 wt % to 24 wt % of an oxidizing agent.

Acids/Chelating Agents

The removal composition may also include an amino acid, amine polycarboxylic acid (i.e., aminopolycarboxylic acid), and/or carboxylic acid, polycarboxylic acid chelating agent, or a mixture thereof. The presence of an amino acid, amine polycarboxylic acid (i.e., aminopolycarboxylic acid), and/or carboxylic acid, polycarboxylic acid chelating agent, or a mixture thereof in combination with an ammonium carboxylate or mixtures of ammonium carboxylates, was observed to stabilize the etch rate up to at least 22 hours or even up to 35 hours.

In some embodiments, the removal composition includes 0.0005 wt % to 20 wt % of an amino acid, amine polycarboxylic acid (i.e., aminopolycarboxylic acid), and/or carboxylic acid, polycarboxylic acid chelating agent, or a mixture thereof. In some embodiments, the removal composition includes 0.001 wt % to 20 wt % of an amino acid, amine polycarboxylic acid (i.e., aminopolycarboxylic acid), and/or carboxylic acid, polycarboxylic acid chelating agent, or a mixture thereof. In another embodiment, the removal composition includes 0.001 wt % to 10 wt % of an amino acid, amine polycarboxylic acid (i.e., aminopolycarboxylic acid), and/or carboxylic acid, polycarboxylic acid chelating agent, or a mixture thereof. In another embodiment, the removal composition includes 0.001 wt % to 5 wt % of an amino acid, amine polycarboxylic acid (i.e., aminopolycarboxylic acid), and/or carboxylic acid, polycarboxylic acid chelating agent, or a mixture thereof. In another embodiment, the removal composition includes 0.001 wt % to 1 wt % of an amino acid, amine polycarboxylic acid (i.e., aminopolycarboxylic acid), and/or carboxylic acid, polycarboxylic acid chelating agent, or a mixture thereof. In another embodiment, the removal composition includes 0.001 wt % to 0.607 wt % of an amino acid, amine polycarboxylic acid (i.e., aminopolycarboxylic acid), and/or carboxylic acid, polycarboxylic acid chelating agent, or a mixture thereof.

Examples of such chelating agents include, but are not limited to, 1,2-cyclohexanediamine-N, N, N', N'-tetraacetic acid (CDTA); ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)

ethane-N,N,N',N'-tetraacetic acid; N-{2-[bis(carboxymethyl)amino]ethyl}-N-(2-hydroxyethyl)glycine (HEDTA); ethylenediamine-N, N'-bis(2-hydroxyphenylacetic acid) (EDDHA); dioxaoctamethylene dinitrilo tetraacetic acid (DOCTA); and triethylenetetraamine hexaacetic acid (TTHA).

The addition of 1,2-cyclohexanediamine-N, N, N', N'-tetraacetic acid to a removal composition having an ammonium carboxylate stabilizes the TiN etch rate up to at least 35 hrs. The etch rate at 50° C. of a removal composition having ammonium carboxylate without 1,2-cyclohexanediamine-N, N, N', N'-tetraacetic acid may decrease 48% or even 54% after 35 hours. Whereas if 0.2 to 0.8 wt % of 1,2-cyclohexanediamine-N, N, N',N'-tetraacetic acid is added the the ammonium carboxylate removal composition TiN etch rate at 50° C. decreases 8% or less and in one embodiment decreases 0.4%. When stability of a removal composition having an ammonium carboxylate is important, 1,2-cyclohexanediamine-N, N, N', N'-tetraacetic acid can be added to the removal composition. The amount of 1,2-cyclohexanediamine-N, N, N', N'-tetraacetic acid can be tailored to achieve the desired stability.

In one embodiment, 1,2-cyclohexanediamine-N, N, N', N'-tetraacetic acid is present in an amount from 0.0005 to 20 wt % based on the total weight percent of the removal composition. In one embodiment, 1,2-cyclohexanediamine-N, N, N', N'-tetraacetic acid is present in an amount from 0.0005 to 10 wt % based on the total weight percent of the removal composition. In one embodiment, 1,2-cyclohexanediamine-N, N, N', N'-tetraacetic acid is present in an amount from 0.001 to 10 wt % based on the total weight percent of the removal composition. In another embodiment, 1,2-cyclohexanediamine-N, N, N', N'-tetraacetic acid is present in an amount from 0.001 to 5 wt %. In another embodiment, 1,2-cyclohexanediamine-N, N, N',N'-tetraacetic acid is present in an amount from 0.001 to 1 wt %. In another embodiment, 1,2-cyclohexanediamine-N, N, N', N'-tetraacetic acid is present in an amount from 0.001 wt % to 0.607 wt %.

In some embodiments, a removal composition comprising
(a) 0.1 wt % to 90 wt % at least one oxidizing agent,
(b) 0.0001 wt % to 50 wt % of an ammonium carboxylate;
(c) 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N, N'-bis(2-hydroxyphenylacetic acid) (EDDHA); dioxaoctamethylene dinitrilo tetraacetic acid; and triethylenetetraamine hexaacetic acid (TTHA); and (d) the balance up to 100 wt % of the removal composition comprising deionized water stabilize the etch rate up to at least 35 hours. In some embodiments, stabilize TiN etch rate up to at least 35 hours. And in some embodiments, stabilize TiN etch rateup to at least 35 hours at a selected operating temperature. In some embodiments, the selected operating temperature is from 20 to 60° C. In another embodiment, the selected operating temperature is between and including any two of the following temperature: 20, 30, 45, 50, 53 and 60° C.

In some embodiments, the addition of a chelating agent stabilizes the TiN etch rate such that TiN etch rate at 50° C. does not drop more than 23 Å/min at 24 hours. In some embodiments, the addition of a chelating agent stabilizes the TiN etch rate such that TiN hard mask etch rate at 50° C. does not drop more than 22.5 Å/min at 24 hours. In some embodiments, the addition of a chelating agent stabilizes the TiN etch rate such that TiN etch rate at 50° C. does not drop more than 20.5 Å/min at 24 hours. In some embodiments, the addition of a chelating agent stabilizes the TiN etch rate such that TiN etch rate at 50° C. does not drop more than 11 Å/min at 24 hours.

Metal Corrosion Inhibitor

Although not required for carrying out the invention, at least one corrosion inhibitor may also be present in the removal composition, for example, where the removal composition is to be deployed in semiconductor processing at BEOL applications and other applications where corrosion of copper or other metal components is a concern. The presence of a corrosion inhibitor is needed to protect metal surfaces from being etched or otherwise degraded. For other applications, including FEOL applications, of the inventive composition and associated method, a corrosion inhibitor(s) is not generally needed, i.e., copper or cobalt, is not exposed to the removal chemistry, copper or cobalt is absent from the wafer substrate, or slight etching/degradation of copper or cobalt surfaces is not usually a concern.

The metal (copper or cobalt) corrosion inhibitor is an organic compound, such as an azole, thiol, and/or indole preferably selected from the group consisting of a heterocyclic compound containing at least one nitrogen atom, such as, for example, a pyrrole and derivatives thereof, pyrazole and derivatives thereof, imidazole and derivatives thereof, triazole and derivatives thereof, indazole and derivatives thereof, and thiol-triazole and derivatives thereof, benzotriazole (BTA), tolyltriazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthothiazole, 2-mercaptobenzimidazole (MBI), 2-mercaptobenzothiazole, 4-methyl-2-phenylimidazole, 2-mercaptothiazoline, 5-aminotetrazole, 5-aminotetrazole monohydrate, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazol, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, and mixtures thereof. Among the foregoing, benzotriazole, pyrazole, or a mixture of benzotriazole and pyrazole, or a mixture of benzotriazole and tolyltriazole (available commercially from Wincom, Inc. under the name "Wintrol A-90"), are preferred copper corrosion inhibitors for better removal performance.

The copper or cobalt corrosion inhibitor or mixture thereof may be present in the composition at from 0.0001 wt % to 50 wt %. In another embodiments, the copper or cobalt corrosion inhibitor or mixture thereof is present in an amount from 0.0001 wt % to 10 wt %. In some embodiments, the copper or cobalt corrosion inhibitor or mixture thereof is present in an amount from 0.5 to 0.9 wt %. I In some embodiments, the copper or cobalt corrosion inhibitor or mixture thereof is present in an amount from 0.18 to 0.8 wt %. In another embodiment, the copper or cobalt corrosion inhibitor or mixture thereof is present in an amount from 0.18 to 0.65 wt %. Other suitable copper or cobalt corrosion inhibitors include, but are not limited to aromatic hydrazides and Schiff base compounds.

In some embodiments, the composition can contain one or more cosolvents that are miscible with water. Cosolvents enhance residue removal. Suitable cosolvents include, but are not limited to, sulfolane, N-methylpyrrolidone, and dimethylsulfoxide.

pH Adjustment

The composition may also include a base or an acid, as appropriate, to adjust the pH of the working composition. The base can, for example, be selected from the group consisting of quaternary ammonium salts, such as tetramethylammonium hydroxide (TMAH), tetraethylammonium hydroxide (TEAH), benzyltrimethylammonium hydroxide (BTAH) and mixtures thereof. The base can also be selected from the group consisting of primary, secondary and tertiary amines, such as, for example, monoethanol amine (MEA), diglycol amine (DGA), triethanolamine (TEA), tetrabutyphosphonium hydroxide (TBPH), and mixtures thereof. In some embodiments, the base can be a combination of quaternary ammonium salts and amines. Suitable acids include, for example, are selected from the group consisting of inorganic acids, such as sulfuric acid, nitric acid, phosphoric acid, hydrofluoric acid (HF), or hydrobromic acid; organic acids, such as a carboxylic acid, an amino acid, a hydroxy carboxylic acid, a polycarboxylic acid, or a mixture of such acids. The pH of the working composition should be maintained at a value of from 2 to 14, but preferably in the range of from 3 to 12. As noted above, when used in BEOL Cu interconnect fabrication applications, the preferred pH of the working composition is in the range of from 5 to 11 when hydrogen peroxide is used as oxidizer in order to achieve high etch rates.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) 0.0005 wt % to 20 wt % of an amino acid, amine polycarboxylic acid (i.e., aminopolycarboxylic acid), and/or carboxylic acid, polycarboxylic acid chelating agent, or a mixture thereof; and
(d) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) 0.0005 wt % to 20 wt % of 1,2-cyclohexanediamine-N, N, N', N'-tetraacetic acid; and
(d) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) a base and mixtures thereof; or an acid and mixtures thereof; or a mixture of base and acid; and
(d) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) 0.0001 to 50 wt % of a metal corrosion inhibitor or a mixture of metal corrosion inhibitors; and
(d) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) 0.0005 wt % to 20 wt % of an amino acid, amine polycarboxylic acid (i.e., aminopolycarboxylic acid), and/or carboxylic acid, polycarboxylic acid chelating agent, or a mixture thereof;
(d) a base and mixtures thereof; or an acid and mixtures thereof; or a mixture of base and acid; and
(e) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of a carboxylate;
(c) 0.0005 wt % to 20 wt % of an amino acid, amine polycarboxylic acid (i.e., aminopolycarboxylic acid), and/or carboxylic acid, polycarboxylic acid chelating agent, or a mixture thereof;
(d) 0.0001 to 50 wt % of a metal corrosion inhibitor;
(e) a base and mixtures thereof; or an acid and mixtures thereof; or a mixture of base and acid; and
(f) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of an oxidizing agent;
(b) 0.0001 wt % to 50 wt % of a carboxylate;
(c) 0.0005 wt % to 20 wt % of 1,2-cyclohexanediamine-N, N, N', N'-tetraacetic acid;
(d) 0.0001 to 50 wt % of a metal corrosion inhibitor or a mixture of metal corrosion inhibitors; and
(e) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of an oxidizing agent;
(b) 0.0001 wt % to 50 wt % of a carboxylate;
(c) 0.0005 wt % to 20 wt % of 1,2-cyclohexanediamine-N, N, N', N'-tetraacetic acid;
(d) 0.0001 to 50 wt % of a metal corrosion inhibitor or a mixture of metal corrosion inhibitors;
(e) a base and mixtures thereof; or an acid and mixtures thereof; or a mixture of base and acid; and
(f) the balance up to 100 wt % of the removal composition comprising deionized water.

And further, the removal composition in accordance with any of the above embodiments, wherein the carboxylate is an ammonium carboxylate. The ammonium carboxylate is selected from the group consisting of ammonium oxalate, ammonium lactate, ammonium tartrate. ammonium citrate tribasic, ammonium acetate, ammonium carbamate, ammonium carbonate, ammonium benzoate, ammonium ethylenediaminetetraacetic acid, diammonium ethylenediaminetetraacetic acid, triammonium ethylenediaminetetraacetic acid, tetraammonium ethylenediaminetetraacetic acid, ammonium succinate, ammonium formate, ammonium 1-H-pyrazole-3-carboxylate and mixtures thereof In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of an oxidizing agent;
(b) 0.0001 wt % to 50 wt % of an ammonium carboxylate;
(c) 0.0005 wt % to 20 wt % of 1,2-cyclohexanediamine-N, N, N', N'-tetraacetic acid;
(d) 0.0001 to 50 wt % of a metal corrosion inhibitor or a mixture of metal corrosion inhibitors;
(e) a base and mixtures thereof; or an acid and mixtures thereof; or a mixture of base and acid; and
(f) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of an oxidizing agent;
(b) 0.0001 wt % to 50 wt % of an ammonium tartrate;
(c) 0.0005 wt % to 20 wt % of 1,2-cyclohexanediamine-N, N, N', N'-tetraacetic acid (CDTA);
(d) 0.0001 to 50 wt % of a metal corrosion inhibitor or a mixture of metal corrosion inhibitors;
(e) a base and mixtures thereof; or an acid and mixtures thereof; or a mixture of base and acid; and
(f) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of hydrogen peroxide;
(b) 0.0001 wt % to 50 wt % of an ammonium carboxylate; and
(c) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of hydrogen peroxide;
(b) 0.0001 wt % to 50 wt % of an ammonium carboxylate;
(c) 0.0005 wt % to 20 wt % of 1,2-cyclohexanediamine-N, N, N', N'-tetraacetic acid; and
(d) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of hydrogen peroxide;
(b) 0.0001 wt % to 50 wt % of an ammonium carboxylate;
(c) 0.0005 wt % to 20 wt % of 1,2-cyclohexanediamine-N, N, N', N'-tetraacetic acid;
(d) from 0.0001 to 50 wt % of a metal corrosion inhibitor or a mixture of metal corrosion inhibitors; and
(e) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:

(a) 0.1 wt % to 90 wt % of an oxidizing agent;
(b) 0.0001 wt % to 50 wt % of an ammonium ethylenediaminetetraacetic acid;
(c) 0.0001 to 50 wt % of a metal corrosion inhibitor or a mixture of metal corrosion inhibitors;
(d) a base and mixtures thereof; or an acid and mixtures thereof; or a mixture of base and acid; and
(e) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of tetraammonium ethylenediaminetetraacetic acid;
(c) 0.0001 to 50 wt % of a metal corrosion inhibitor or a mixture of metal corrosion inhibitors;
(d) a base and mixtures thereof; or an acid and mixtures thereof; or a mixture of base and acid; and
(e) the balance up to 100 wt % of the removal composition comprising deionized water.

In one embodiment, the removal composition for selectively removing an hard mask consisting essentially of TiN, TaN, TiNxOy, TiW, W, Ti and alloys of Ti and W relative to low-k dielectric material from a semiconductor substrate which comprises the low-k dielectric material having a TiN, TaN, TiNxOy, TiW, W, Ti or alloy of Ti or W hard mask thereon, the removal composition comprising:
(a) 0.1 wt % to 90 wt % of an oxidizing agent;
(b) 0.0001 wt % to 50 wt % of tetraammonium ethylenediaminetetraacetic acid;
(c) 0.0005 wt % to 20 wt % of 1,2-cyclohexanediamine-N, N, N', N'-tetraacetic acid;
(d) 0.0001 to 50 wt % of a metal corrosion inhibitor or a mixture of metal corrosion inhibitors;
(e) a base and mixtures thereof; or an acid and mixtures thereof; or a mixture of base and acid; and
(f) the balance up to 100 wt % of the removal composition comprising deionized water.

Kit

Another embodiment of the present disclosure is a kit including one or more containers comprising one or more components adapted to form the removal composition. In some embodiments the kit includes in one or more containers, comprising at least one carboxylate and deionized water for combining with an oxidizing agent at the point or fabrication or the point of use. In another embodiment, the kit includes in one or more containers, comprising at least one carboxylate; deionized water; at least one copper corrosion inhibitor; and optionally comprising a base, a acid or mixture thereof for adjusting the pH; and optionally comprising at least one cosolvent for combining with an oxidizing agent at the point or fabrication or the point of use. In another embodiment, the kit includes in one or more containers, comprising at least one carboxylate; deionized water; at least one amino acid, amine polycarboxylic acid (i.e., aminopolycarboxylic acid), and/or carboxylic acid, polycarboxylic acid chelating agent; and optionally comprising a base, a acid or mixture thereof for adjusting the pH; and optionally comprising at least one cosolvent for combining with an oxidizing agent at the point or fabrication or the point of use. In another embodiment, the kit includes in one or more containers, comprising at least one carboxylate; deionized water; at least one copper corrosion inhibitor; at least one amino acid, amine polycarboxylic acid (i.e., aminopolycarboxylic acid), and/or carboxylic acid, polycarboxylic acid chelating agent; optionally comprising a base, a acid or mixture thereof for adjusting the pH; and optionally comprising at least one cosolvent for combining with an oxidizing agent at the point or fabrication or the point of use.

Method

Removal composition is applied in any suitable manner to the semiconductor substrate. Contact or contacting the semiconductor substrate is intended to include spraying, dipping, using a pad or applicator that has the removal composition absorbed thereon or any other suitable manner of contacting the semiconductor substrate with a removal composition.

In one embodiment, a method for selectively removing an hard mask consisting essentially of TiN, TaN, TiNxOy, TiW, W, Ti, including alloys of Ti or W, relative to underlying Low-k, Cu, Co, SiON, SICN, and TEOS materials from a semiconductor substrate having a TiN, TaN, TiNxOy, TiW, W, or Ti hard mask thereon, including an hard mask comprising alloys of Ti or W, wherein the method comprises contacting the semiconductor substrate with a removal composition comprising:
(a) 0.1 wt % to 90 wt % at least one oxidizing agent;
(b) 0.0001 wt % up to 50 wt % of a carboxylate; and
(c) the balance up to 100 wt % of the removal composition comprising deionized water.

In some embodiments, the method for selectively removing an hard mask consisting essentially of TiN, TaN, TiNxOy, TiW, W, Ti, including alloys of Ti or W, relative to underlying Low-k, Cu, Co, SiON, SICN, and TEOS materials from a semiconductor substrate having a TiN, TaN, TiNxOy, TiW, W, or Ti hard mask thereon, including an hard mask comprising alloys of Ti or W, wherein the method comprises contacting the semiconductor substrate with a removal composition comprising:
(a) 0.1 wt % to 90 wt % at least one oxidizing agent;
(b) 0.0001 wt % up to 50 wt % of an ammonium carboxylate; and
(c) the balance up to 100 wt % of the removal composition comprising deionized water.

In some embodiments, the method for selectively removing an hard mask consisting essentially of TiN, TaN, TiNxOy, TiW, W, Ti, including alloys of Ti or W, relative to underlying Low-k, Cu, Co, SiON, SICN, and TEOS materials from a semiconductor substrate having a TiN, TaN, TiNxOy, TiW, W, or Ti hard mask thereon, including an hard mask comprising alloys of Ti or W, wherein the method comprises contacting the semiconductor substrate with a removal composition comprising:
(a) from 0.1 wt % to 90 wt % at least one oxidizing agent;
(b) from 0.0001 wt % up to 50 wt % of an ammonium carboxylate selected from the group consisting of ammonium oxalate, ammonium lactate, ammonium tartrate. ammonium citrate tribasic, ammonium acetate, ammonium carbamate, ammonium carbonate, ammonium benzoate, ammonium ethylenediaminetetraacetic acid, diammonium ethylenediaminetetraacetic acid, triammonium ethylenediaminetetraacetic acid, tetraammonium ethylenediaminetetraacetic acid, ammonium succinate, ammonium formate, ammonium 1-H-pyrazole-3-carboxylate and mixtures thereof; and
(c) the balance up to 100 wt % of the removal composition comprising deionized water.

In some embodiments in accordance with any of the above methods, the removal composition may additionally comprise at least one metal corrosion inhibitor. In some embodiments in accordance with any of the above methods, the removal composition may additionally comprise from 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid (DOCTA); and triethylenetetraamine hexaacetic acid (TTHA). In some embodiments in accordance with any of the above methods, the removal composition may additionally comprise at least one base, at least one acid or mixture thereof; wherein the base is selected from the group consisting of quaternary ammonium salts, primary amines, secondary amines, tertiary amines; and wherein the acid is selected from the group consisting of inorganic acids, organic acids or mixtures thereof.

In some embodiments in accordance with any of the above methods, the removal composition may additionally comprise at least one base at least one acid or mixture thereof, wherein the base is selected from tetramethylammonium hydroxide (TMAH), tetraethylammonium hydroxide (TEAH), benzyltrimethylammonium hydroxide (BTAH), monoethanol amine (MEA), diglycol amine (DGA), triethanolamine (TEA), tetrabutyphosphonium hydroxide (TBPH), and mixtures thereof and the acid is selected from the group consisting of inorganic acids, organic acids or mixtures thereof.

In some embodiments, the method for removing a hard mask consisting essentially of TiN, TaN, TiNxOy, TiW, W, Ti and alloys of Ti and W from a semiconductor substrate, the method comprising contacting the semiconductor substrate with a removal composition comprising:
(a) 0.1 wt % to 90 wt % at least one oxidizing agent,
(b) 0.0001 wt % to 50 wt % of a carboxylate;
(c) the balance up to 100 wt % of the removal composition comprising deionized water In some embodiments, the method additionally comprises the heating the removal composition up to 60° C. Heating the removal composition can occur prior to contacting the semiconductor substrate or after. In some embodiments, the method comprises contacting the semiconductor substrate with a removal composition for at least 2 minutes at a temperature from 20 to 45, 50, 53 or 60° C. In some embodiments, the method comprises contacting the semiconductor substrate with a removal composition for at least 2 minutes at a temperature up to 60° C.

A composition formulated according to the present disclosure and exhibiting an inherently high etch rate for TiN, TaN, TiNxOy, TiW, W, Ti, including alloys of Ti and W, enables processing at relatively low temperature, e.g., temperatures less than 65° C. A relatively low temperature process exhibits a reduced oxidizer decomposition rate, which, in turn, extends the useful composition bath life and pot life. Additionally, compositions according to the invention which exhibit high and selective etch rates for TiN, TaN, TiNxOy, TiW, W, Ti, including alloys of Ti and W, are desirable because they can reduce device processing time and thereby increase throughput. Typically, high etch rates for TiN, TaN, TiNxOy, TiW, W, Ti, including alloys of Ti and W, have been achieved by increasing process temperatures. However, for single wafer process applications, the highest processing temperature is around 75° C., which, in turn, can limit the upper end of etch rates for TiN, and thereby limit the ability for one to completely remove TiN hard mask from a dual damascene structure. Compositions according to the invention can effectively deliver high etch rates for TiN, TaN, TiNxOy, TiW, W, Ti, including alloys of Ti and W, with single wafer tool applications at a temperature range of from 20° C. to 60° C., and the TiN, TaN, TiNxOy, TiW, W, Ti, including alloys of Ti and W, hard mask can be fully removed with single wafer application process equipment if so desired.

In some embodiments, the removal composition is at a temperature from 20 to 45, 50, 53 or 60° C. and at a pH from 2 to 14. In some embodiments, the removal composition is at a temperature from 20 to 45, 50, 53 or 60° C. and at a pH from 5 to 12. In some embodiments, the removal composition is at a temperature from 20, 30 or 45 to 50, 53 or 60° C. and at a pH from 2 to 14.

In some embodiments, the removal composition is at a temperature from 20, 30 or 45 to 50, 53 or 60° C. and at a pH from 5 to 12.

The removal composition has an etch rate that is stabilized up to at least 35 hours at a selected operating temperature. In some embodiments, the selected operating temperature is from 20 to 45, 50, 53 or 60° C.

In a preferred embodiment, the concentration of ammonium carboxylate is from 0.001 wt % up to 50 wt %. The compositions of the invention are effective in selectively removing an hard mask consisting essentially of TiN, TaN, TiNxOy, TiW, W, Ti, including alloys of Ti and/or W, relative to Low-k, Cu, Co, SiON, SICN, and TEOS materials from a semiconductor substrate comprising said low-k dielectric material and having a TiN, TaN, TiNxOy, TiW, W, Ti, including alloys of Ti and/or W, hard mask thereon. In addition, the composition is also functional in simultaneously removing photoresist, polymeric materials, etching residues and copper oxide from the substrate.

The compositions and method according to the inventive concepts described herein are particularly applicable for processing single wafers in single wafer equipment. When a high TiN etch rate is required, a common approach is to process wafers at high process temperatures. However, higher temperatures are known to contribute to degradation of the oxidizing agent which shortens bath life and pot life. It has been observed according to the inventive concepts described herein that satisfactory results can be achieved at substantially lower temperatures in the range of from 20° C. to 60° C. to generate a pullback scheme or to completely remove the hard mask when the hard mask comprises TiN.

EXAMPLES

Removal compositions according to the invention are now explained in detail by reference to the inventive concepts and examples which follow, but the present invention is not limited by these examples and the results shown for each test. Compositions of the invention may be embodied in a wide variety of specific formulations, as hereinafter more fully described. In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 wt %, based on the total weight of the composition in which such components are employed.

In the examples which follow, 100 g. samples of removal compositions were prepared according to the inventive concept(s) described herein. Each sample composition comprised each of the components listed in the various tables which follow at the weights shown in the corresponding formulation row. For example, a 100 g. quantity of sample composition designated "1" shown in Table 1 contained 2 g.

of 10% aqueous ammonium tartrate, 7.21 g. of 10% aqueous DGA, 12.43 g. of 1.5% aqueous BTA, 60 g. H2O2 (30% aqueous), and 18.36 g. deionized water (DIW).

The removal compositions can be formulated at the point of use, or they can be conveniently formulated beforehand without an oxidizer and then taken to the point of use where the oxidizer is added. There is also no particular sequence for mixing or blending the various ingredients.

Blank wafers for determining etch rate were purchased as follows:
Cu blank wafer—from Silicon Valley Microelectronics, Inc.,
Co blank wafer—from Silicon Valley Microelectronics, Inc.,
TiN blank wafer—from Silyb wafer services,
W—from Silicon Valley Microelectronics, Inc.
TEOS—from Silicon Valley Microelectronics, Inc
BDII and BDIII blank wafers—from DK Nanotechnology
TiN, Cu, Co, W and TEOS Etch Rate Etch rate evaluations were carried out after 1 and 2 minutes of chemical treatment for TiN and 10 minutes for Cu, Co, W, and TEOS at the temperature noted in each example. TiN, Cu, Co, and W thicknesses were measured using a Four Dimensions Four Point Probe Meter 333A, whereby the resistivity of the film was correlated to the thickness of the film remaining after contact with the composition of the invention. The TEOS thickness was measured with Auto SE Spectroscopic Ellipsometer by HORIBA JOBIN YVWON. The etch rate was calculated as the thickness change (before and after chemical treatment) divided by the chemical treatment time. Chemical solution pH was measured with a Beckman 260 pH/Temp/mV meter. The $H_2O_2$ used in the experiments was sourced from J. T. Baker. Residue removal efficiency and TiN hard mask etch were evaluated from SEM results (Hitachi S-5500).

The compositions shown in Table 1 were prepared using deionized water as the solvent, BTA or a mixture of BTA and pyrazole as Cu corrosion inhibitor, $H_2O_2$ as the oxidizing agent, and diglycolamine (DGA) or benzyltrimethylammonium hydroxide (BTAH) as the base to adjust pH. TiN and Cu etch rate evaluations were carried out as described above at a temperature of 50° C. and a pH of about 8.

relatively low temperature in the range of from 50° C. to 53° C. A copper etch rate of less than 3 Å/min is considered good for commercial wafer processing.

Figure 1B:
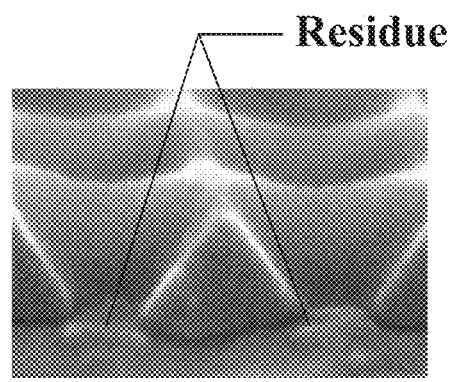
Figure 2A:
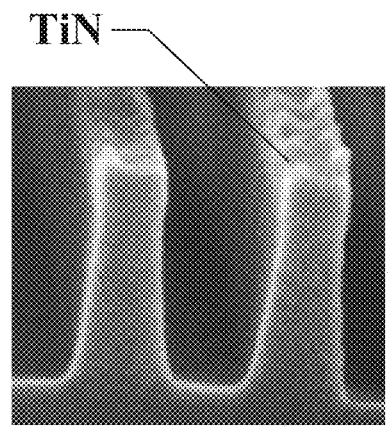
FIGS. 2A and 2B are cross-sectional SEM images of semiconductor wafer segments of the type shown in FIGS. 1A and 1B after contact with removal composition 1 from Table 1 at 50° C. for 90 sec.
Figure 2B:
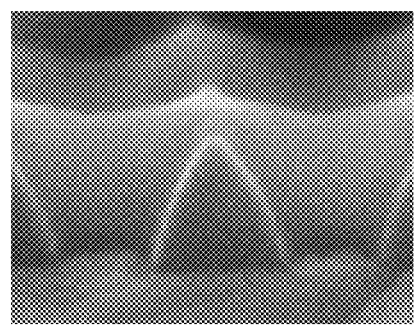
Figure 3A:
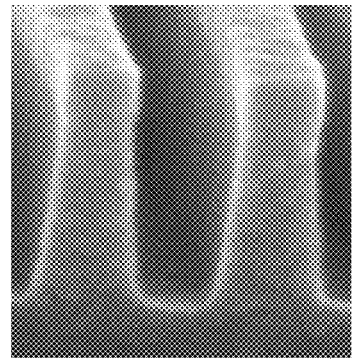
FIGS. 3A and 3B are cross-sectional SEM images of semiconductor wafer segments of the type shown in FIGS. 1A and 1B after contact with removal composition 2 from Table 1 at 50° C. for 90 sec.
Figure 3B:
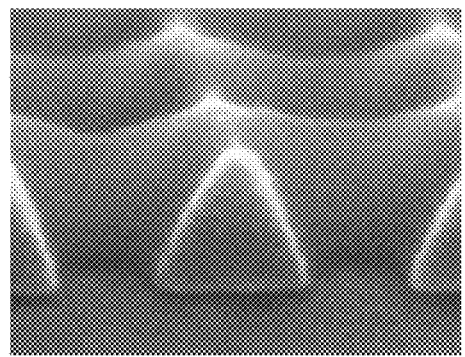
Figure 4A:
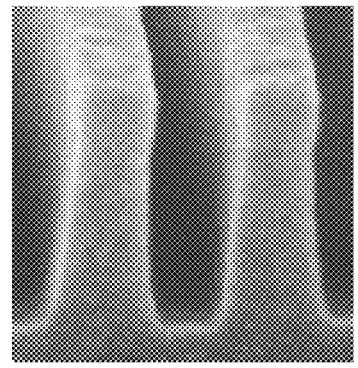
FIGS. 4A and 4B are cross-sectional SEM images of semiconductor wafer segments of the type shown in FIGS.
Figure 4B:
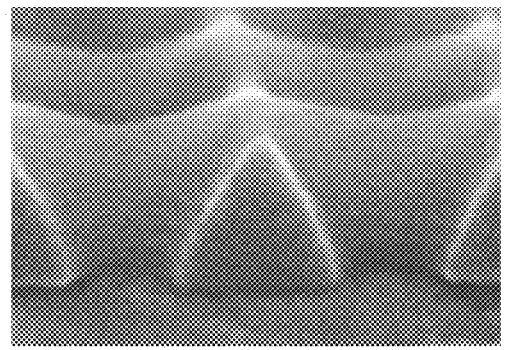

Referring now to the Figs., FIGS. 1A and 1B are SEM images of semiconductor wafer segments which show trenches and vias, respectively, as received following a dual damascene fabrication step, but before treatment with a removal composition. FIGS. 2A and 2B are views of the wafer segments, similar to the wafer segments shown in FIGS. 1A and 1B, after contact with removal composition 1 for 90 sec. at a temperature of 50° C. Residue was removed, but some TiN hard mask remained as noted in FIG. 2A. FIGS. 3A and 3B are views of wafer segments, similar to the wafer segments shown in FIGS. 1A and 1B, after contact with removal composition 2 for 90 sec. at a temperature of 50° C. wherein TiN hard mask and residue have been completely removed. FIGS. 4a and 4B are views of wafer segments, similar to the wafer segments shown in FIGS. 1A and 1B, after contact with removal composition 3 for 90 sec. at a temperature of 53° C. TiN hard mask and residue have been completely removed.

The compositions shown in Table 2 were prepared using deionized water as the solvent, BTA as Cu corrosion inhibitor, $H_2O_2$ as the oxidizing agent, and tetramethylammonium hydroxide (TMAH) as the base to adjust pH. TiN and Cu etch rate evaluations were carried out as described above at a temperature of 60° C. and a pH of about 7.8.

Each of the removal compositions, which contain, respectively, the ammonium lactate, ammonium tartrate, ammonium carbonate, and ammonium citrate tribasic at the amounts indicated, demonstrated a higher TiN etch rate

TABLE 1

| Test | Ammonium Tartrate (10%) | DGA (10%) | Benzyltrimethylammonium Hydroxide (40%) | Pyrazole | BTA (1.5%) | $H_2O_2$ (30%) | DIW | pH | TiN (Å/min) | Cu (Å/min) |
|---|---|---|---|---|---|---|---|---|---|---|
| 1 | 2 | 7.210 | 0 | 0 | 12.43 | 60 | 18.36 | 8.4 | 178 (50° C.) | 1.3 (50° C.) |
| 2 | 3 | 3.010 | 0 | 0.5 | 10 | 70 | 13.49 | 7.6 | 209 (50° C.) | 1.9 (50° C.) |
| 3 | 3.5 | 0.000 | 2.564 | 0.2 | 11.25 | 60 | 22.49 | 8.4 | 340 (53° C.) | 2.5 (53° C.) |

Compositions 1, 2 and 3 demonstrated a removal rate for TiN in the range of from 178 Å/min up to 340 Å/min at a compared with the corresponding control, composition 4, that did not contain an ammonium carboxylate.

TABLE 2

| Test | Ammonium Lactate (10%) | Ammonium Tartrate (10%) | Ammonium Carbonate (10%) | Ammonium Citrate Tribasic (10%) | BTA (1.5%) | TMAH (25%) | DIW | $H_2O_2$ (30%) | pH | TiN (Å/min) at 60° C. | Cu (Å/min) at 60° C. |
|---|---|---|---|---|---|---|---|---|---|---|---|
| 4 | 0 | 0 | 0 | 0 | 12 | 0.816 | 27.18 | 60 | 7.8 | 215 | 0.98 |
| 5 | 1.632 | 0 | 0 | 0 | 12 | 0.409 | 25.96 | 60 | 7.8 | 404 | 1.61 |
| 6 | 0 | 2.807 | 0 | 0 | 12 | 0.818 | 24.38 | 60 | 7.8 | 464 | 1.33 |

TABLE 2-continued

| Test | Ammonium Lactate (10%) | Ammonium Tartrate (10%) | Ammonium Carbonate (10%) | Ammonium Citrate Tribasic (10%) | BTA (1.5%) | TMAH (25%) | DIW | $H_2O_2$ (30%) | pH | TiN (Å/min) at 60° C. | Cu (Å/min) at 60° C. |
|---|---|---|---|---|---|---|---|---|---|---|---|
| 7 | 0 | 0 | 1.46 | 0 | 12 | 0.305 | 26.24 | 60 | 7.8 | 432 | 1.61 |
| 8 | 0 | 0 | 0 | 3.706 | 12 | 0.869 | 23.43 | 60 | 7.8 | 436 | 1.84 |

The formulations shown in Table 3 were prepared, and TiN and Cu etch rate evaluations were carried out as described above at a temperature of 50° C. and pH of 8. The removal compositions demonstrated a higher TiN etch rate and similar copper etch rate when compared to the control, composition 9, that did not contain an ammonium carboxylate.

TABLE 3

| Test | Ammonium Carbonate (10%) | Ammonium Acetate (10%) | Saturated Ammonium Oxalate (5.5%) | BTA (1.5%) | Tetrabutyl-phosphonium Hydroxide (40%) | DIW | $H_2O_2$ (30%) | pH | TiN (Å/min) at 50° C. | Cu (Å/min) at 50° C. |
|---|---|---|---|---|---|---|---|---|---|---|
| 9 | 0 | 0 | 0 | 12 | 1.592 | 26.41 | 60 | 8 | 68 | 0.99 |
| 10 | 1.46 | 0 | 0 | 12 | 0.998 | 25.54 | 60 | 8 | 170 | 0.94 |
| 11 | 0 | 1.172 | 0 | 12 | 1.575 | 25.25 | 60 | 8 | 150 | 1.28 |
| 12 | 0 | 0 | 1.887 | 12 | 1.530 | 24.58 | 60 | 8 | 154 | 1.17 |

The formulations shown in Table 4 were prepared using DGA to adjust the pH, and BTA was used as the copper corrosion inhibitor. TiN and Cu etch rate evaluations were carried out as described above at a temperature of 50° C. and pH of 8. The removal compositions demonstrated a higher TiN etch rate and a similar Cu etch rate when compared to the control, composition 13, that did not contain an ammonium carboxylate.

TABLE 4

| Test | Ammonium Carbonate (10%) | Ammonium Acetate (10%) | Saturated Ammonium Oxalate (5.5%) | BTA (1.5%) | DGA (10%) | DIW | $H_2O_2$ (30%) | pH | TiN (Å/min) at 50° C. | Cu (Å/min) at 50° C. |
|---|---|---|---|---|---|---|---|---|---|---|
| 13 | 0 | 0 | 0 | 12 | 2.645 | 25.36 | 60 | 7.9 | 98 | 0.33 |
| 14 | 1.46 | 0 | 0 | 12 | 1.790 | 24.75 | 60 | 8.0 | 147 | 1.62 |
| 15 | 0 | 1.172 | 0 | 12 | 2.601 | 24.23 | 60 | 8.0 | 146 | 0.2 |
| 16 | 0 | 0 | 1.887 | 12 | 2.502 | 23.61 | 60 | 7.9 | 140 | 0.83 |

The formulations shown in Table 5 were prepared using TMAH to adjust the pH, and BTA was used as the copper corrosion inhibitor. TiN and Cu etch rate evaluations were carried out as described above at a temperature of 50° C. and pH of 8. The removal compositions demonstrated a higher TiN etch rate and a similar Cu etch rate when compared to the control, composition 17, that did not contain an ammonium carboxylate.

TABLE 5

| Test | Ammonium Carbonate (10%) | Ammonium Acetate (10%) | Saturated Ammonium Oxalate (5.5%) | BTA (1.5%) | TMAH (25%) | DIW | H$_2$O$_2$ (30%) | pH | TiN (Å/min) at 50° C. | Cu (Å/min) at 50° C. |
|---|---|---|---|---|---|---|---|---|---|---|
| 17 | 0 | 0 | 0 | 12 | 0.975 | 27.03 | 60 | 8 | 99 | 0.12 |
| 18 | 1.46 | 0 | 0 | 12 | 0.611 | 25.93 | 60 | 8 | 200 | 1.85 |
| 19 | 0 | 1.172 | 0 | 12 | 0.866 | 25.96 | 60 | 8 | 191 | 1.08 |
| 20 | 0 | 0 | 1.887 | 12 | 0.828 | 25.29 | 60 | 8 | 197 | 1.53 |

The formulations shown in Table 6 were prepared using benzyltrimethylammonium hydroxide (BTAH) to adjust the pH, and BTA was used as the copper corrosion inhibitor. TiN and Cu etch rate evaluations were carried out as described above at a temperature of 50° C. and pH of about 8. The removal compositions demonstrated a higher TiN etch rate and a similar Cu etch rate when compared to the control, composition 21, that did not contain an ammonium carboxylate.

TABLE 6

| Test | Ammonium Carbonate (10%) | Ammonium Acetate (10%) | Saturated Ammonium Oxalate (5.5%) | BTA (1.5%) | Benzyltrimethylammonium Hydroxide (40%) | DIW | H$_2$O$_2$ (30%) | pH | TiN (Å/min) at 50° C. | Cu (Å/min) at 50° C. |
|---|---|---|---|---|---|---|---|---|---|---|
| 21 | 0 | 0 | 0 | 12 | 1.127 | 26.87 | 60 | 8 | 100 | 0.7 |
| 22 | 1.46 | 0 | 0 | 12 | 0.744 | 25.80 | 60 | 8 | 178 | 0.63 |
| 23 | 0 | 1.172 | 0 | 12 | 1.078 | 25.75 | 60 | 8 | 174 | 0.54 |
| 24 | 0 | 0 | 1.887 | 12 | 1.036 | 25.08 | 60 | 8 | 164 | 0.75 |

The formulations shown in Table 7 were prepared using tetraethylammonium hydroxide (TEAH) to adjust the pH, and BTA was used as the copper corrosion inhibitor. TiN and Cu etch rate evaluations were carried out as described above at a temperature of 50° C. and pH of 8. The removal compositions demonstrated a higher TiN etch rate and a similar Cu etch rate when compared to the control, composition 25, that did not contain an ammonium carboxylate.

out as described above at a temperature of 50° C. and pH of about 8. The removal compositions demonstrated a higher TiN etch rate when compared to the control, composition 31, that did not contain an ammonium carboxylate.

The presence of the ammonium carbonate, ammonium acetate, ammonium oxalate, ammonium lactate and ammonium tartrate at concentrations of from 1.46 wt % to less than 3 wt % operate to provide the removal compositions of the invention with the capability to deliver very high TiN etch rates at relatively low temperature, e.g., 50° C. It is noteworthy according to the described and claimed inventive concepts that none of the ammonium carbonate, ammonium

TABLE 7

| Test | Ammonium Carbonate (10%) | Ammonium Acetate (10%) | Saturated Ammonium Oxalate (5.5%) | Ammonium Citrate Tribasic (10%) | Ammonium Tartrate (10%) | BTA (1.5%) | TEAH (20%) | DIW | H$_2$O$_2$ (30%) | pH | TiN (Å/min) at 50° C. | Cu (Å/min) at 50° C. |
|---|---|---|---|---|---|---|---|---|---|---|---|---|
| 25 | 0 | 0 | 0 | 0 | 0 | 12 | 2.46 | 25.54 | 60 | 8 | 94 | 0.39 |
| 26 | 1.46 | 0 | 0 | 0 | 0 | 12 | 1.64 | 24.90 | 60 | 8 | 214 | 0.92 |
| 27 | 0 | 1.172 | 0 | 0 | 0 | 12 | 2.86 | 24.17 | 60 | 8 | 218 | 0.01 |
| 28 | 0 | 0 | 1.887 | 0 | 0 | 12 | 2.74 | 23.37 | 60 | 8 | 197 | −0.72 |
| 29 | 0 | 0 | 0 | 3.706 | 0 | 12 | 2.60 | 21.69 | 60 | 8 | 235 | −0.46 |
| 30 | 0 | 0 | 0 | 0 | 2.807 | 12 | 2.53 | 22.66 | 60 | 8 | 209 | 0.03 |

The formulations shown in Table 8 were prepared using DGA to adjust the pH, but no copper corrosion inhibitor was used. TiN and TEOS removal rate evaluations were carried acetate, ammonium oxalate, ammonium lactate or ammonium tartrate had significant effect on TEOS removal rate when compared to the control, composition 31.

TABLE 8

| Test | Ammonium Carbonate (10%) | Ammonium Acetate (10%) | Saturated Ammonium Oxalate (5.5%) | Ammonium Lactate (10%) | Ammonium Tartrate (10%) | DGA (10%) | DIW | H$_2$O$_2$ (30%) | pH | TiN (Å/min) at 50° C. | TEOS (Å/min) at 50° C. |
|---|---|---|---|---|---|---|---|---|---|---|---|
| 31 | 0 | 0 | 0 | 0 | 0 | 2.65 | 37.35 | 60 | 7.93 | 87 | 0.01 |
| 32 | 1.46 | 0 | 0 | 0 | 0 | 1.52 | 37.02 | 60 | 7.94 | 161 | 0.2 |
| 33 | 0 | 1.172 | 0 | 0 | 0 | 2.37 | 36.46 | 60 | 7.90 | 165 | −0.1 |

TABLE 8-continued

| Test | Ammonium Carbonate (10%) | Ammonium Acetate (10%) | Saturated Ammonium Oxalate (5.5%) | Ammonium Lactate (10%) | Ammonium Tartrate (10%) | DGA (10%) | DIW | H$_2$O$_2$ (30%) | pH | TiN(Å/min) at 50° C. | TEOS (Å/min) at 50° C. |
|---|---|---|---|---|---|---|---|---|---|---|---|
| 34 | 0 | 0 | 1.887 | 0 | 0 | 2.38 | 35.73 | 60 | 7.90 | 144 | 0.61 |
| 35 | 0 | 0 | 0 | 1.632 | 0 | 0.94 | 37.43 | 60 | 7.91 | 181 | 0.48 |
| 36 | 0 | 0 | 0 | 0 | 2.807 | 2.19 | 35.00 | 60 | 7.91 | 179 | 0.07 |

The formulations shown in Table 9 were prepared without the use of a pH adjustment agent. The Cu corrosion inhibitor used was Wintrol A-90, a commercial mixture of BTA and tolyltriazole. The desired TiN and Cu etch rates and pH were obtained by varying hydrogen peroxide and ammonium carboxylate concentrations. In these examples, several carboxylates in various concentrations were used. Hydrogen peroxide concentration was either 20 wt % or 80 wt %. The formulation pH's ranged from a low of pH 4.3 up to pH 8.3, and the TiN etch rate, i.e., the removal rate, ranged from a low of 11 Å/min up to 228 Å/min.

TABLE 9

| Test | Ammonium Carbonate (10%) | Ammonium Acetate (10%) | Ammonium Tartrate (10%) | Tetra-ammonium EDTA (10%) | Ammonium Oxalate (10%) | Ammonium Lactate (10%) | Wintrol A-90 | DIW | H$_2$O$_2$ (30%) | pH | TiN (Å/min) at 50° C. | Cu (Å/min) at 50° C. |
|---|---|---|---|---|---|---|---|---|---|---|---|---|
| 37 | 1.46 | 0 | 0 | 0 | 0 | 0 | 0.2 | 78.3 | 20 | 8.3 | 92 | 0.38 |
| 38 | 0 | 0 | 5 | 0 | 0 | 0 | 0.2 | 74.8 | 20 | 6.0 | 23 | 2.27 |
| 39 | 0 | 0 | 0 | 10 | 0 | 0 | 0.2 | 59.8 | 30 | 8.3 | 116 | 2.19 |
| 40 | 0 | 1.172 | 0 | 0 | 0 | 0 | 0.2 | 78.6 | 20 | 6.2 | 25 | 0.89 |
| 41 | 0 | 0 | 0 | 0 | 0.35 | 0 | 0.2 | 79.5 | 20 | 5.1 | 11 | 0.13 |
| 42 | 0 | 0 | 0 | 0 | 0 | 1.632 | 0.2 | 78.2 | 20 | 7.9 | 73 | 0.11 |
| 43 | 1.46 | 0 | 0 | 0 | 0 | 0 | 0.2 | 18.3 | 80 | 7.1 | 228 | 1.00 |
| 44 | 0 | 1.172 | 0 | 0 | 0 | 0 | 0.2 | 18.6 | 80 | 5.5 | 82 | 0.41 |
| 45 | 0 | 0 | 0 | 0 | 0.1925 | 0 | 0.2 | 19.8 | 80 | 4.3 | 45 | 1.63 |
| 46 | 0 | 0 | 0 | 0 | 0 | 1.632 | 0.2 | 18.2 | 80 | 6.4 | 173 | 0.60 |

The formulations shown in Table 10 were prepared with tartaric acid, or TMAH, or without any pH adjustment agent. Wintrol A-90 was used as a Co corrosion inhibitor. In these examples, several carboxylates in various concentrations were used. Hydrogen peroxide concentration ranged from 10 wt % to 80 wt %. The formulation pH ranged from a low of pH 5 up to pH 10. The Co etch rate was insignificant in all cases (i.e., the highest Co etch rate was 1.48 Å/min).

TABLE 10

| Test | Ammonium Tartrate dibasic (10%) | Ammonium Lactate (10%) | Ammonium Carbonate (10%) | Wintrol A-90 | Tartaric acid (10%) | TEAH (20%) | DIW | H$_2$O$_2$ (30%) | pH | Co(Å/min) |
|---|---|---|---|---|---|---|---|---|---|---|
| 47 | 0 | 1.632 | 0 | 0.2 | 0.585 | 0 | 37.6 | 60 | 5.00 | 1.48 |
| 48 | 2.807 | 0 | 0 | 0.2 | 0 | 0.1 | 36.9 | 60 | 6.50 | 0.21 |
| 49 | 0 | 1.632 | 0 | 0.2 | 0 | 1.9 | 56.3 | 40 | 8.04 | −0.48 |
| 50 | 2.807 | 0 | 0 | 0.2 | 0 | 6.25 | 80.7 | 10 | 10.00 | 0.51 |
| 51 | 0 | 0 | 1.46 | 0.2 | 0 | 0 | 18.3 | 80 | 7.11 | −0.16 |
| 52 | 2.807 | 0 | 0 | 0.2 | 0 | 2.842 | 74.2 | 20 | 9.00 | 0.49 |

The results shown in Table 11 demonstrate that a mixture of ammonium lactate and ammonium tartrate in removal composition 54 exhibited a higher TiN etch rate when compared to the control, composition 53, which contained no ammonium carboxylate.

TABLE 11

| Test | Ammonium Lactate (10%) | Ammonium Tartrate (10%) | BTA (1.5%) | TMAH (25%) | DIW | H$_2$O$_2$ (30%) | pH | TiN (Å/min) at 50° C. | Cu (Å/min) at 50° C. | Co (Å/min) at 50° C. |
|---|---|---|---|---|---|---|---|---|---|---|
| 53 | 0 | 0 | 12 | 1.28 | 26.72 | 60 | 8 | 135 | −0.1 | 0.3 |
| 54 | 0.041 | 0.702 | 12 | 1.49 | 25.77 | 60 | 8 | 203 | 0.2 | 0.8 |

The formulations shown in Table 12 were prepared using TMAH to adjust the pH, and BTA was used as copper corrosion inhibitor. Carboxylates used were potassium citrate tribasic monohydrate, potassium sodium tartrate tetrahydrate, and potassium L-lactate in compositions 56, 57 and 58, respectively. Each of these compositions demonstrated a higher TiN etch rate and a similar Cu etch rate when compared to the control, composition 55, that did not contain a carboxylate.

TABLE 12

| Test | Potassium Citrate Tribasic Monohydrate (100%) | Potassium Sodium Tartrate Tetrahydrate (100%) | Potassium L-Lactate (60%) | BTA (1.5%) | TMAH (25%) | DIW | H$_2$O$_2$ (30%) | pH | TiN (Å/min) at 50° C. | Cu (Å/min) at 50° C. |
|---|---|---|---|---|---|---|---|---|---|---|
| 55 | 0 | 0 | 0 | 12 | 1.266 | 26.73 | 60 | 8.0 | 110 | 0.1 |
| 56 | 0.4944 | 0 | 0 | 12 | 1.194 | 26.31 | 60 | 8.0 | 192 | 1.5 |
| 57 | 0 | 0.432 | 0 | 12 | 1.266 | 26.30 | 60 | 8.0 | 175 | −0.1 |
| 58 | 0 | 0 | 0.3256 | 12 | 1.252 | 26.42 | 60 | 8.0 | 167 | 0.1 |

The results shown in Table 13 indicate that at ammonium carboxylate concentrations as low as 0.001%, removal compositions 60 through 63 exhibited higher TiN etch rates and similar Cu and Co etch rates when compared to the control, composition 59.

TABLE 13

| Test | Ammonium Lactate (10%) | Ammonium Tartrate (10%) | Ammonium Carbonate (10%) | Ammonium Citrate Tribasic (10%) | BTA (1.5%) | TMAH (25%) | DIW | H$_2$O$_2$ (30%) | pH | TiN (Å/min) at 50° C. | Cu (Å/min) at 50° C. | Co (Å/min) at 50° C. |
|---|---|---|---|---|---|---|---|---|---|---|---|---|
| 59 | 0 | 0 | 0 | 0 | 12 | 1.30 | 26.70 | 60 | 8 | 86 | 0.3 | 0.7 |
| 60 | 0.01 | 0 | 0 | 0 | 12 | 1.69 | 26.30 | 60 | 8 | 93 | 0.2 | 0.6 |
| 61 | 0 | 0.01 | 0 | 0 | 12 | 1.51 | 26.48 | 60 | 8 | 107 | 0.0 | 0.6 |
| 62 | 0 | 0 | 0.01 | 0 | 12 | 1.53 | 26.46 | 60 | 8 | 119 | 0.4 | 0.6 |
| 63 | 0 | 0 | 0 | 0.01 | 12 | 1.37 | 26.62 | 60 | 8 | 102 | 0.1 | 0.4 |

The results shown in Table 14 demonstrate that at an ammonium acetate concentration of 50 wt %, removal composition 65 exhibited a higher TiN etch rate and similar Cu and Co etch rates when compared to the control, composition 64, which contained no ammonium carboxylate.

TABLE 14

| Test | Ammonium Acetate (100%) | BTA (1.5%) | DGA (10%) | DIW | H$_2$O$_2$ (30%) | pH | TiN (Å/min) at 30° C. | Cu (Å/min) at 30° C. | Co (Å/min) at 30° C. |
|---|---|---|---|---|---|---|---|---|---|
| 64 | 0 | 12 | 1.060 | 56.94 | 30 | 7.8 | 8 | 0.3 | 0.1 |
| 65 | 50 | 12 | 4.450 | 3.55 | 30 | 7.8 | 18 | 1.6 | 0.3 |

Tungsten (W) Etch Rate

The formulations shown in Table 15 were prepared, and W (tungsten) etch rate evaluations were carried out at temperatures of 45° C. and 55° C. as described above in connection with TiN removal.

TABLE 15

| Test | Ammonium Carbonate (10%) | Ammonium Acetate (10%) | Saturated Ammonium Oxalate (5.5%) | Ammonium Tartrate (10%) | DGA (10%) | TMAH (25%) | Tartaric Acid (10%) | DIW | $H_2O_2$ (30%) | pH | W (Å/min) at 45° C. |
|---|---|---|---|---|---|---|---|---|---|---|---|
| 66 | 0 | 0 | 0 | 0 | 2.645 | 0 | 0.00 | 37.4 | 60 | 7.9 | 173 |
| 67 | 1.46 | 0 | 0 | 0 | 1.790 | 0 | 0.00 | 36.8 | 60 | 8.0 | 401 |
| 68 | 0 | 1.172 | 0 | 0 | 2.601 | 0 | 0.00 | 36.2 | 60 | 8.0 | 444 |
| 69 | 0 | 0 | 1.887 | 0 | 2.502 | 0 | 0.00 | 35.6 | 60 | 7.9 | 361 |
| 70 | 0 | 0 | 0 | 0 | 0.000 | 19.517 | 0.00 | 20.5 | 60 | 11.1 | 365 |
| 71 | 0 | 0 | 0 | 3 | 0.000 | 20.272 | 0.00 | 16.7 | 60 | 11.1 | 771 |
| 72 | 0 | 0 | 0 | 0 | 0.000 | 0 | 0.42 | 40.0 | 60 | 3.9 | 751 (55° C.) |
| 73 | 0 | 0 | 0 | 3 | 0.000 | 0 | 0.48 | 36.5 | 60 | 3.9 | 1046 (55° C.) |

Table 15 demonstrates the presence of ammonium carboxylate at a concentration of 1.172 wt % to 3 wt % and at a pH ranging from about 4 to slightly higher than 11 was shown to significantly increase the W removal rate when compared to the corresponding ammonium carboxylate-free control compositions 66, 70 and 72 at the same pH.

Removal Composition Stability

Pot life is a measure of the ability of the removal composition formula to perform optimally over time and without significant variation in functionality over time. Pot life is a strong function of temperature. After many hours of treatment at high temperature, the chemicals in the mixture can decompose and the formula will lose functionality. Pot life studies were conducted (to confirm the period of time during which, and the extent to which, the etch rates of the removal compositions of the invention remained constant) as follows: 1200 gram stock solutions were prepared and maintained at 50° C. 150 gram samples were removed from the heated stock solution and used for TiN and Cu etch rate and pH studies at specific times at 50° C. The samples were discarded after each etch rate measurement.

Removal compositions were prepared according to the described and claimed inventive concept(s) wherein ammonium tartrate was selected as the ammonium carboxylate at a concentration of 0.3 wt %. 1,2-cyclohexanediamine-N, N, N', N'-tetraacetic acid (CDTA) was selected as the aminopolycarboxylic acid chelating agent in formulation 74, 75, and no chelating agent (CDTA) was included in the control formulation 76. The compositions are shown in Table 16. Results are shown in Table 17.

TABLE 16

| Test | Ammonium Tartrate (10%) | Pyrazole | CDTA (100%) | TEAH (20%) | BTA (1.5%) | DIW | $H_2O_2$ (30%) | pH |
|---|---|---|---|---|---|---|---|---|
| 74 | 3 | 0.3 | 0.200 | 3.122 | 12.120 | 21.258 | 60 | 8.07 |
| 75 | 3 | 0.3 | 0.607 | 5.482 | 12.120 | 18.491 | 60 | 8.05 |
| 76 | 3 | 0.3 | 0.000 | 2.220 | 12.120 | 22.36 | 60 | 8.15 |

TABLE 17

| Test | Time (hr) | TiN (Å/min) at 50° C. | Cu (Å/min) at 50° C. |
|---|---|---|---|
| 74 | 0 | 168.1 | 0.12 |
| 75 |   | 157.0 | 0.03 |
| 76 |   | 219.0 | −0.02 |
| 74 | 2 | 166.0 | 0.53 |
| 75 |   | 143.7 | 0.46 |
| 76 |   | 211.2 | 0.45 |
| 74 | 4 | 163.7 | 1.42 |
| 75 |   | 155.5 | 0.90 |
| 76 |   | 203.6 | 0.62 |
| 74 | 7.5 | 159.4 | 0.77 |
| 75 |   | 157.4 | 1.11 |
| 76 |   | 166.6 | −0.02 |
| 74 | 22 | 156.6 | 0.53 |
| 75 |   | 156.4 | 1.47 |
| 76 |   | 99.9 | 0.52 |

The data presented in Table 17 demonstrates that with CDTA in removal compositions 74 and 75, the TiN etch rate remained stable, i.e., substantially constant, over a period of 22 hours. The initial TiN etch rate was 157 Å/min, and it remained at 156.4 Å/min for composition 75 over a 22 hour period. For composition 74 the initial TiN etch rate was 168.1 Å/min and remained at 156.6 Å/min over a 22 hour period. In composition 76, without CDTA, the TiN etch rate declined from an initial etch rate of 219 Å/min to an etch rate of 99.9 Å/min at 22 hours.

TABLE 18

| Test | Ammonium Tartrate (10%) | Pyrazole | CDTA (100%) | TEAH (20%) | BTA (1.5%) | DIW | H2O2 (30%) | pH |
|---|---|---|---|---|---|---|---|---|
| 77 | 2.5 | 0.300 | 0.500 | 5.108 | 12.0 | 19.59 | 60 | 7.9 |
| 78 | 2.5 | 0.300 | 0.000 | 2.210 | 12.0 | 22.99 | 60 | 7.9 |

TABLE 19

| Test | Time (hr) | TiN (Å/min) at 50° C. | Cu (Å/min) at 50° C. |
|---|---|---|---|
| 77 | 0 | 174 | 2.20 |
| 78 |   | 212 | 1.59 |
| 77 | 4 | 178 | 1.49 |
| 78 |   | 194 | 0.83 |
| 77 | 8 | 170 | 1.70 |
| 78 |   | 180 | 1.49 |
| 77 | 24 | 171 | 1.77 |
| 78 |   | 150 | 1.24 |
| 77 | 28 | 163 | 1.25 |
| 78 |   | 118 | 0.59 |
| 77 | 32 | 159 | 0.93 |
| 78 |   | 109 | 0.58 |
| 77 | 35 | 160 | 1.07 |
| 78 |   | 110 | 0.88 |

The data presented in Table 19 demonstrates that with CDTA in removal compositions 77, the TiN etch rate remained stable, i.e., substantially constant, over a period of 35 hour. The initial TiN etch rate was 174 Å/min, and it is at 160 Å/min for composition 77 at 35 hour period. In composition 78 without CDTA, the TiN etch rate declined from an initial etch rate of 212 Å/min to an etch rate of 110 Å/min at 35 hours.

Removal compositions were prepared according to the described and claimed inventive concept(s) wherein Tetraammonium ethylenediaminetetraacetic acid, Triammonium ethylenediaminetetraacetic acid and Diammonium ethylenediaminetetraacetic acid was selected as the ammonium carboxylate at a concentration of specified in Table 20. 1,2-cyclohexanediamine-N, N, N', N'-tetraacetic acid (CDTA) was selected as the aminopolycarboxylic acid chelating agent in formulation 79, 80 and 81. The compositions are shown in Table 20.

Samples were taken from the removal compositions at intervals of 0, 4, 8, 24, 28, 32 and 35 hours to measure TiN and Cu etch rates. Results are shown in Table 21.

TABLE 20

| Test | Tetraammonium EDTA (10%) | Triammonium EDTA (10%) | Diammonium EDTA (10%) | TEAH (20%) | BTA (1.5%) | CDTA (100%) | DIW | H2O2 (30%) | pH |
|---|---|---|---|---|---|---|---|---|---|
| 79 | 3.25 | 0 | 0 | 4.781 | 12 | 0.5 | 19.47 | 60 | 7.9 |
| 80 | 0 | 3.1928 | 0 | 5.470 | 12 | 0.5 | 18.84 | 60 | 7.9 |
| 81 | 0 | 0 | 3.035 | 5.888 | 12 | 0.5 | 18.58 | 60 | 7.9 |

TABLE 21

| Test | Time (hr) | TiN (Å/min) at 50° C. | Cu (Å/min) at 50° C. |
|---|---|---|---|
| 79 | 0 | 192 | 2.24 |
| 80 |   | 181 | 1.73 |

TABLE 21-continued

| Test | Time (hr) | TiN (Å/min) at 50° C. | Cu (Å/min) at 50° C. |
|---|---|---|---|
| 81 |   | 167 | 1.27 |
| 79 | 4 | 184 | 2.59 |
| 80 |   | 182 | 1.76 |
| 81 |   | 160 | 1.82 |
| 79 | 8 | 190 | 1.85 |
| 80 |   | 182 | 2.26 |
| 81 |   | 166 | 1.36 |
| 79 | 24 | 169 | 1.33 |
| 80 |   | 161 | 1.27 |
| 81 |   | 156 | 1.99 |
| 79 | 28 | 174 | 0.66 |
| 80 |   | 164 | 0.22 |
| 81 |   | 157 | 1.61 |
| 79 | 32 | 173 | 1.68 |
| 80 |   | 167 | 1.59 |
| 81 |   | 154 | 1.46 |
| 79 | 35 | 176 | 1.65 |
| 80 |   | 171 | 1.23 |
| 81 |   | 160 | 1.60 |

The data presented in Table 21 demonstrates that with CDTA in removal compositions 79, 80 and 81, the TiN etch rate remained stable, i.e., substantially constant, over a period of 35 hours. The initial TiN etch rate was 192 Å/min, and it is at 176 Å/min for composition 79 over a 35 hour period. For composition 80, the initial TiN etch rate was 181 Å/min and is at 171 Å/min over a 35 hour period. For composition 81 the initial TiN etch rate was 167 Å/min and is at 160 Å/min over a 35 hour period.

Removal compositions were prepared according to the described and claimed inventive concept(s) wherein ammonium tartrate was selected as the ammonium carboxylate at a concentration of 0.3 wt %. 1,2-cyclohexanediamine-N, N, N', N'-tetraacetic acid (CDTA) was selected as the aminopolycarboxylic acid chelating agent in formulation 82 and 83. The compositions are shown in Table 22. Samples were taken from the removal compositions at intervals of 0, 4, 8, 24, 28, 32 and 35 hours to measure TiN and Cu etch rates. Results are shown in Table 23.

TABLE 22

| Test | (NH4)2 Tartrate dibasic (10%) | Pyrazole | TEAH (20%) | BTA (1.5%) | CDTA (100%) | DIW | H₂O₂ (30%) | pH |
|---|---|---|---|---|---|---|---|---|
| 82 | 3 | 0.3 | 0.404 | 12.12 | 0.001 | 74.18 | 10 | 8.0 |
| 83 | 3 | 0.3 | 0.632 | 12.12 | 0.005 | 73.94 | 10 | 8.2 |
| 84 | 3 | 0.3 | 0.387 | 12.12 | 0 | 74.19 | 10 | 8.0 |

TABLE 23

| Test | Time (hr) | TiN (Å/min) at 50° C. | Cu (Å/min) at 50° C. |
|---|---|---|---|
| 82 | 0 | 42 | −0.13 |
| 83 |  | 48 | 0.21 |
| 84 |  | 47 | 0.04 |
| 82 | 4 | 41 | 0.13 |
| 83 |  | 49 | −0.17 |
| 84 |  | 41 | 0.09 |
| 82 | 8 | 40 | 0.53 |
| 83 |  | 47 | 0.88 |
| 84 |  | 37 | 1.20 |
| 82 | 24 | 40 | 0.39 |
| 83 |  | 47 | −0.38 |
| 84 |  | 33 | 0.59 |
| 82 | 28 | 38 | 0.54 |
| 83 |  | 46 | 0.43 |
| 84 |  | 32 | 0.81 |
| 82 | 32 | 38 | 0.44 |
| 83 |  | 46 | 0.88 |
| 84 |  | 30 | 1.08 |
| 82 | 35 | 36 | 0.23 |
| 83 |  | 45 | 1.22 |
| 84 |  | 30 | 1.21 |

The data presented in Table 23 demonstrates that with 0.001% and 0.005% of CDTA in removal compositions 82 and 83, respectively, the TiN etch rate remained stable, i.e., substantially constant, over a period of 35 hours. The initial TiN etch rate was 42 Å/min, and it remained at 36 Å/min for composition 82 over a 35 hour period (16.67% reduced TiN etch rate). For composition 83, the initial TiN etch rate was 48 Å/min and remained at 45 Å/min over a 35 hour period (6.3% reduced TiN etch rate). For comparison, control formulation 84 without CDTA, the initial TiN etch rate was 47 Å/min, and it is at 30 Å/min for over a 35 hour period which shows a 36% reduced TiN etch rate. CDTA stabilizes TiN etch rate.

The formulations shown in Table 24 were prepared using TEAH to adjust the pH, and BTA was used as copper corrosion inhibitor. CDTA was used to stabilize TiN etch rate.

A pot life study of Table 24 formulations were conducted according to the method described above. Samples were taken at intervals of 0, 4, 8, 24, 28, 32 and 35 hours to measure TiN and Cu etch rates and pH. Results are shown in Table 25.

TABLE 24

| Test | (NH4)2 Tartrate dibasic (10%) | TEAH (20%) | BTA (1.5%) | CDTA (100%) | DIW | H₂O₂ (30%) | pH |
|---|---|---|---|---|---|---|---|
| 85 | 2.5 | 18.910 | 12 | 3 | 3.59 | 60 | 7.84 |
| 86 | 2.5 | 13.189 | 12 | 2 | 10.31 | 60 | 7.84 |
| 87 | 2.5 | 7.518 | 12 | 1 | 16.98 | 60 | 7.84 |
| 88 | 2.5 | 1.974 | 12 | 0 | 23.53 | 60 | 7.84 |

TABLE 25

| Test | Time (hr) | TiN (Å/min) at 50° C. | Cu (Å/min) at 50° C. |
|---|---|---|---|
| 85 | 0 | 170 | 1.79 |
| 86 |  | 170 | 1.96 |
| 87 |  | 178 | 1.84 |
| 88 |  | 233 | 1.78 |
| 85 | 4 | 167 | 1.68 |
| 86 |  | 170 | 0.33 |
| 87 |  | 173 | 0.57 |
| 88 |  | 196 | 1.21 |
| 85 | 8 | 165 | 1.75 |
| 86 |  | 167 | 1.81 |
| 87 |  | 171 | 0.78 |
| 88 |  | 190 | 0.64 |
| 85 | 24 | 156 | 1.70 |
| 86 |  | 160 | 1.71 |
| 87 |  | 168 | 1.78 |
| 88 |  | 151 | 1.01 |
| 85 | 28 | 153 | 2.51 |
| 86 |  | 156 | 2.39 |
| 87 |  | 168 | 1.21 |
| 88 |  | 144 | 0.96 |
| 85 | 32 | 151 | 2.74 |
| 86 |  | 155 | 2.56 |
| 87 |  | 166 | 1.75 |
| 88 |  | 137 | 1.32 |
| 85 | 35 | 159 | 2.90 |
| 86 |  | 158 | 2.41 |
| 87 |  | 166 | 1.84 |
| 88 |  | 136 | 0.82 |

The data presented in Table 25 demonstrate that with 1%, 2% and 3% CDTA in removal compositions 85, 86 and 87, respectively, the TiN etch rate remained stable, i.e., substantially constant, over a period of 35 hours. The initial TiN etch rate was 170 Å/min, and it remained at 159 Å/min for composition 85 at a 35 hour period. For composition 86, the initial TiN etch rate was 170 Å/min and remained at 158 Å/min at 35 hour period. For composition 87, the initial TiN etch rate was 178 Å/min and remained at 166 Å/min at 35 hour period. For comparison, control formulation 88 without CDTA, the initial TiN etch rate was 233 Å/min, and it is at 136 Å/min for over a 35 hour period. CDTA stabilizes TiN etch rate.

The formulations shown in Table 26 were prepared using DGA to adjust the pH, and BTA was used as copper corrosion inhibitor. Tetraammonium ethylenediaminetetraacetic acid was used to stabilize the TiN etch rate.

A pot life study of Table 26 formulations were conducted according to the method described above. Samples were taken at intervals of 0, 2, 4, 8, 24, 28 and 35 hours to measure TiN and Cu etch rates and pH. Results are shown in Table 27.

TABLE 26

| Test | Tetra-ammonium EDTA (10%) | Pyra-zole | DGA (10%) | BTA (1.5%) | DIW | H$_2$O$_2$ (30%) | pH |
|---|---|---|---|---|---|---|---|
| 89 | 6.0 | 0.300 | 1.740 | 12.12 | 19.84 | 60 | 7.9 |
| 90 | 0.0 | 0.300 | 3.360 | 12.12 | 24.22 | 60 | 7.9 |

TABLE 27

| Test | Time (hr) | TiN (Å/min) at 50° C. | Cu (Å/min) at 50° C. |
|---|---|---|---|
| 89 | 0 | 224 | 2.07 |
| 90 |   | 143 | 0.90 |
| 89 | 2 | 223 | 1.15 |
| 90 |   | 127 | 0.47 |
| 89 | 4 | 225 | 1.96 |
| 90 |   | 112 | 1.44 |
| 89 | 8 | 219 | 0.88 |
| 90 |   | 96 | 0.28 |
| 89 | 24 | 192 | 0.96 |
| 90 |   | 75 | 0.78 |
| 89 | 28 | 190 | 1.36 |
| 90 |   | 64 | 0.55 |
| 89 | 35 | 179 | 0.73 |
| 90 |   | 57 | 0.36 |

Table 27 demonstrates that with tetraammonium ethylenediaminetetraacetate in removal composition 89, the TiN etch rate remained stable, i.e., remained substantially constant, over a period of thirty five (35) hours. The initial TiN etch rate was 224 Å/min, and it is at 179 Å/min at thirty five (35) hour (20% TiN etch rate drop after 35 hours). In composition 90, without Tetraammonium ethylenediaminetetraacetate, the etch rate dropped from an initial rate of 143 Å/min to a rate of 57 Å/min after 35 hours (60% TiN etch rate drop after 35 hours). Tetraammonium ethylenediaminetetraacetate stabilizes TiN etch rate.

The formulations in Table 28 were prepared using DGA to adjust pH. BTA was used as copper corrosion inhibitor. The ammonium carboxylate selected was tetraammonium EDTA. The results shown in Table 28 indicate that Tetraammonium ethylenediaminetetraacetate in removal composition 81 exhibited a higher TiN etch rate when compared to the control, composition 82, which contained no ammonium carboxylate.

TABLE 28

| Test | Pyrazole | DGA (10%) | Tetraammonium EDTA (10%) | BTA (1.5%) | DIW | H$_2$O$_2$ (30%) | TiN (Å/min) at 50° C. | Cu (Å/min) at 50° C. | pH |
|---|---|---|---|---|---|---|---|---|---|
| 91 | 0.3 | 1.740 | 6.0 | 12.12 | 19.84 | 60 | 233 | 1.97 | 7.9 |
| 92 | 0.3 | 3.360 | 0.0 | 12.12 | 24.22 | 60 | 134 | 0.18 | 7.9 |

TABLE 29

| Test | Time (hr) | TiN (Å/min) at 50° C. | Cu (Å/min) at 50° C. |
|---|---|---|---|
| 91 | 0 | 233 | 2.07 |
| 92 |   | 134 | 0.90 |
| 91 | 2 | 232 | 1.15 |
| 92 |   | 119 | 0.47 |
| 91 | 4 | 234 | 1.96 |
| 92 |   | 105 | 1.44 |
| 91 | 8 | 228 | 0.88 |
| 92 |   | 90 | 0.28 |
| 91 | 24 | 200 | 0.96 |
| 92 |   | 71 | 0.78 |

TABLE 29-continued

| Test | Time (hr) | TiN (Å/min) at 50° C. | Cu (Å/min) at 50° C. |
|---|---|---|---|
| 91 | 28 | 198 | 1.36 |
| 92 |   | 61 | 0.55 |

The experimental results shown in Table 29 demonstrate that with tetraammonium ethylenediaminetetraacetate in removal composition 81, the initial TiN etch rate was 233 Å/min, and it is 198 Å/min at twenty eight (28) hour period. In composition 92, without Tetraammonium ethylenediaminetetraacetate, the TiN etch rate dropped from an initial rate of 134 Å/min to a rate of 61 Å/min at 28 hours.

The presence of ammonium carboxylate in the removal compositions of the invention not only increased TiN etch rate as shown in Tables 2 through 8, 11, 13 through 15, and 26 and 27, but the data support the conclusion that their presence also operates to stabilize the TiN etch rate over an extended period of time, e.g., up to at least 35 hours.

Several embodiments of the inventive concepts have been described. However, those ordinarily skilled in the art will recognize that the invention is not limited to the embodiments described. The inventive concepts can be practiced with modifications and alteration within the spirit and scope of the appended claims.

What is claimed is:

1. A method for removing a hard mask consisting essentially of TiN, TaN, TiNxOy, TiW, W, Ti and alloys of Ti and W from a semiconductor substrate, the method comprising contacting the semiconductor substrate with a removal composition comprising:
   (a) 0.1 wt % to 90 wt % at least one oxidizing agent,
   (b) 0.0001 wt % to 50 wt % of a carboxylate;
   (c) from 0.0001 wt % up to 50 wt % of a metal corrosion inhibitor; and
   (d) the balance up to 100 wt % of the removal composition comprising deionized water;
   wherein said metal corrosion inhibitor is one or more members selected from the group consisting of pyrazole and derivatives thereof, and indazole and derivatives thereof.

2. The method of claim 1, wherein the oxidizing agent is selected from the group consisting of hydrogen peroxide (H2O2), n-methylmorpholine oxide (NMMO or NMO), benzoyl peroxide, tetrabutylammonium peroxymonosulfate, ozone, ferric chloride, permanganate peroxoborate, perchlorate, persulfate, ammonium peroxydisulfate, per acetic acid, urea hydroperoxide, nitric acid (HNO3), ammonium chlorite (NH4ClO2), ammonium chlorate (NH4ClO3), ammonium iodate (NH4IO3), ammonium perborate (NH4BO3), ammonium perchlorate (NH4ClO4), ammonium periodate (NH4IO3), ammonium persulfate ((NH4)2S2O8), tetramethylammonium chlorite ((N(CH3)4)ClO2), tetramethylammonium chlorate ((N(CH3)4)ClO3), tetramethylammonium iodate ((N(CH3)4)IO3), tetramethylammonium perborate ((N(CH3)4)BO3), tetramethylammonium perchlorate ((N(CH3)4)ClO4), tetramethylammonium periodate ((N(CH3)4)IO4), tetramethylammonium persulfate ((N(CH3)4)S2O8), ((CO(NH2)2)H2O2), peracetic acid (CH3(CO)OOH), and mixtures thereof; and the carboxylate is selected from the group consisting of potassium citrate tribasic monohydrate, potassium sodium tartrate tetrahydrate, potassium L-Lactate and mixtures thereof.

3. The method of claim 2, wherein the removal composition further comprises from 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid; and triethylenetetraamine hexaacetic acid (TTHA).

4. The method of claim 2, wherein the removal composition further comprises at least one base, at least one acid or mixture thereof; wherein the base is selected from the group consisting of quaternary ammonium salts, primary amines, secondary amines, tertiary amines, tetramethylammonium hydroxide (TMAH), tetraethylammonium hydroxide (TEAH), benzyltrimethylammonium hydroxide (BTAH), monoethanol amine (MEA), diglycol amine (DGA), triethanolamine (TEA), tetrabutyphosphonium hydroxide (TBPH), and mixtures thereof; and wherein the acid is selected from the group consisting of inorganic acids, organic acids or mixtures thereof.

5. The method of claim 2, wherein the removal composition further comprises: i) 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid; and triethylenetetraamine hexaacetic acid (TTHA).

6. The method of claim 2, wherein the removal composition further comprises: i) 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1, 2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid; and triethylenetetraamine hexaacetic acid (TTHA); and ii) at least one base, at least one acid or mixture thereof; wherein the base is selected from the group consisting of quaternary ammonium salts, primary amines, secondary amines, tertiary amines, tetramethylammonium hydroxide (TMAH), tetraethylammonium hydroxide (TEAH), benzyltrimethylammonium hydroxide (BTAH), monoethanol amine (MEA), diglycol amine (DGA), triethanolamine (TEA), tetrabutyphosphonium hydroxide (TBPH), and mixtures thereof; and wherein the acid is selected from the group consisting of inorganic acids, a carboxylic acid, an amino acid, a hydroxy carboxylic acid, a polycarboxylic acid, and a mixture thereof.

7. The method of claim 1, wherein the carboxylate is an ammonium carboxylate.

8. The method of claim 7, wherein the oxidizing agent is selected from the group consisting of hydrogen peroxide (H2O2), n-methylmorpholine oxide (NMMO or NMO), benzoyl peroxide, tetrabutylammonium peroxymonosulfate, ozone, ferric chloride, permanganate peroxoborate, perchlorate, persulfate, ammonium peroxydisulfate, per acetic acid, urea hydroperoxide, nitric acid (HNO3), ammonium chlorite (NH4ClO2), ammonium chlorate (NH4ClO3), ammonium iodate (NH4IO3), ammonium perborate (NH4BO3), ammonium perchlorate (NH4ClO4), ammonium periodate (NH4IO3), ammonium persulfate ((NH4)2S2O8), tetramethylammonium chlorite ((N(CH3)4)ClO2), tetramethylamionium chlorate ((N(CH3)4)ClO3), tetramethylammonium iodate ((N(CH3)4)IO3), tetramethylammonium perborate ((N(CH3)4)BO3), tetramethylammonium perchlorate ((N(CH3)4)ClO4), tetramethylammonium periodate ((N(CH3)4)IO4), tetramethylammonium persulfate ((N(CH3)4)S2O8), ((CO(NH2)2)H2O2), peracetic acid (CH3(CO)OOH), and mixtures thereof; and the ammonium carboxylate is selected from the group consisting of ammonium oxalate, ammonium lactate, ammonium tartrate, ammonium citrate tribasic, ammonium acetate, ammonium carbamate, ammonium carbonate, ammonium benzoate, ammonium ethylenediaminetetraacetic acid, diammonium ethylenediaminetetraacetic acid, triammonium ethylenediaminetetraacetic acid, tetraammonium ethylenediaminetetraacetic acid, ammonium succinate, ammonium formate, ammonium 1-H-pyrazole-3-carboxylate and mixtures thereof.

9. The method of claim 8, wherein the removal composition further comprises from 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid; and triethylenetetraamine hexaacetic acid (TTNA).

10. The method of claim 8, wherein the removal composition further comprises at least one base, at least one acid or mixture thereof; wherein the base is selected from the group consisting of quaternary ammonium salts, primary amines, secondary amines, tertiary amines, tetramethylammonium hydroxide (TMAH), tetraethylammonium hydroxide (TEAH), benzyltrimethylammonium hydroxide (BTAH), monoethanol amine (MEA), diglycol amine (DGA), triethanolamine (TEA), tetrabutyphosphonium hydroxide (TBPH), and mixtures thereof; and wherein the acid is selected from the group consisting of inorganic acids, organic acids or mixtures thereof.

11. The method of claim 8, wherein the removal composition further comprises: 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1, 2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N, N'-bis(2-hydroxyphenylacetic acid) (EDDHA); dioxaoctamethylene dinitrilo tetraacetic acid; and triethylenetetraamine hexaacetic acid (TTHA).

12. The method of claim 8, wherein the removal composition further comprises: i) 0.001 wt % to 20 wt % of an amino acid, an aminopolycarboxylic acid, a carboxylic acid, a polycarboxylic acid, or a mixture thereof selected from the group consisting of 1,2-cyclohexanediamine-N, N, N', N'-tetraacetic acid; ethylenediaminetetraacetic acid; nitrilotriacetic acid; diethylene triamine pentaacetic acid; 1,4,7,10-tetraazacyclododecane-1,4,7,10-tetraacetic acid; ethylene glycol tetraacetic acid (EGTA); 1,2-bis(o-aminophenoxy)ethane-N,N,N',N'-tetraacetic acid; N-{2-[bis(carboxymethyl)amino]ethyl}-N-(2-hydroxyethyl)glycine (HEDTA); and ethylenediamine-N,N'-bis(2-hydroxyphenylacetic acid) (EDDHA); dioxaoctamethylene dinitrilo tetraacetic acid; and triethylenetetraamine hexaacetic acid (TTHA); and ii) at least one base, at least one acid or mixture thereof; wherein the base is selected from the group consisting of quaternary ammonium salts, primary amines, secondary amines, tertiary amines, tetramethylammonium hydroxide (TMAH), tetraethylammonium hydroxide (TEAH), benzyltrimethylammonium hydroxide (BTAH), monoethanol amine (MEA), diglycol amine (DGA), triethanolamine (TEA), tetrabutyphosphonium hydroxide (TBPH), and mixtures thereof; and wherein the acid is selected from the group consisting of inorganic acids, a carboxylic acid, an amino acid, a hydroxy carboxylic acid, a polycarboxylic acid, and a mixture thereof.

13. The method of claim 8, wherein the removal composition further comprises 0.001 wt % to 20 wt % 1,2-cyclohexanediamine-N, N, N', N'-tetraacetic acid.

14. The method of claim 8, wherein the ammonium carboxylate is selected from ammonium tartrate.

15. The method of claim 8, wherein the ammonium carboxylate is selected from the group consisting of ammonium ethylenediaminetetraacetic acid, diammonium ethylenediaminetetraacetic acid, triammonium ethylenediaminetetraacetic acid, tetraammonium ethylenediaminetetraacetic acid and mixtures thereof.

16. The method of claim 8, wherein etch rate of a hard mask is stabilized up to at least 35 hours.

17. The method of claim 1, additionally comprising heating the removal composition up to 60° C.

18. The method of claim 1, wherein the removal composition further comprising benzotriazole.

19. The method of claim 1, wherein the removal composition further comprising tolyltriazole.

* * * * *